United States Patent
Cho et al.

(10) Patent No.: US 7,715,200 B2
(45) Date of Patent: May 11, 2010

(54) STACKED SEMICONDUCTOR MODULE, METHOD OF FABRICATING THE SAME, AND ELECTRONIC SYSTEM USING THE SAME

(75) Inventors: Jung-Chan Cho, Cheonan-si (KR);
Yang-Je Lee, Cheongju-si (KR);
Hyun-Seok Choi, Cheonan-si (KR);
Yong-Hyun Kim, Suwon-si (KR);
Jung-Hyeon Kim, Hwaseong-si (KR);
Hyo-Jae Bang, Cheonan-si (KR);
Do-Hyung Kim, Yongin-si (KR);
Kyoung-Sun Kim, Uijeongbu-si (KR);
Young-Ho Lee, Yongin-si (KR);
Jae-Sang Baik, Suwon-si (KR);
Yong-Jin Kim, Suwon-si (KR)

(73) Assignees: Samsung Electronics Co., Ltd., Gyeonggi-do (KR); Samsung Electro-Mechanics, Gyeonggi-do (KR)

( * ) Notice: Subject to any disclaimer, the term of this patent is extended or adjusted under 35 U.S.C. 154(b) by 33 days.

(21) Appl. No.: 12/232,990

(22) Filed: Sep. 26, 2008

(65) Prior Publication Data
US 2009/0129041 A1 May 21, 2009

(30) Foreign Application Priority Data
Sep. 28, 2007 (KR) .................. 10-2007-0098026
Sep. 17, 2008 (KR) .................. 10-2008-0090880

(51) Int. Cl.
*H05K 1/00* (2006.01)
(52) U.S. Cl. .................. 361/749; 361/803; 361/783; 361/785; 361/719; 361/737; 174/254
(58) Field of Classification Search .................. 361/749, 361/803, 710, 709, 728–737, 783, 767, 771, 361/720, 785, 719, 790–795; 174/254; 257/679, 257/706, 720, 707, E23.065–E23.067; 439/633, 439/493, 629, 630, 631
See application file for complete search history.

(56) References Cited

U.S. PATENT DOCUMENTS 5,949,657 A 9/1999 Karabatsos (Continued)

FOREIGN PATENT DOCUMENTS

JP 05-335714 12/1993

(Continued)

*Primary Examiner*—Jinhee J Lee
*Assistant Examiner*—Hoa C Nguyen
(74) *Attorney, Agent, or Firm*—Harness, Dickey & Pierce, P.L.C.

(57) ABSTRACT

A stacked semiconductor module, a method of fabricating the same, and an electronic system using the module are provided. A first semiconductor module having a plurality of semiconductor devices mounted on a rigid printed circuit board (PCB) and a second semiconductor module having a plurality of other semiconductor devices mounted on a flexible PCB are provided. On the rigid PCB a number L of first tabs may be disposed on a first surface, and a number K of second tabs may be disposed on a second surface of the rigid PCB. The flexible PCB may have a number M of third tabs on a third surface, and a number N of fourth tabs on a fourth surface of the flexible PCB. The second tabs may be combined with the third tabs using a conductive adhesive. The third tabs may be electrically connected to corresponding ones of the second tabs.

18 Claims, 17 Drawing Sheets

U.S. PATENT DOCUMENTS

| | | |
|---|---|---|
| 6,021,048 A | 2/2000 | Smith |
| 6,320,750 B2 * | 11/2001 | Shaler et al. ................. 361/736 |
| 6,614,664 B2 | 9/2003 | Lee |
| 7,072,201 B2 | 7/2006 | So et al. |
| 2004/0085795 A1 * | 5/2004 | Braun et al. ................... 365/51 |
| 2006/0049513 A1 * | 3/2006 | Goodwin .................... 257/712 |
| 2006/0050492 A1 | 3/2006 | Goodwin et al. |
| 2006/0090102 A1 * | 4/2006 | Wehrly et al. ................. 714/42 |
| 2006/0091529 A1 * | 5/2006 | Wehrly et al. ............... 257/706 |
| 2007/0212919 A1 * | 9/2007 | Clayton et al. .............. 439/326 |
| 2008/0088001 A1 * | 4/2008 | Kim et al. ................... 257/686 |

FOREIGN PATENT DOCUMENTS

| | | |
|---|---|---|
| JP | 10-284684 | 10/1998 |
| JP | 2005-063448 | 3/2005 |
| JP | 2007-103554 | 4/2007 |
| KR | 1020020031806 | 5/2002 |
| KR | 1020040079780 | 9/2004 |
| KR | 1020050017353 | 2/2005 |
| KR | 1020060050487 | 5/2006 |
| KR | 1020060052696 | 5/2006 |

\* cited by examiner

STACKED SEMICONDUCTOR MODULE, METHOD OF FABRICATING THE SAME, AND ELECTRONIC SYSTEM USING THE SAME

PRIORITY STATEMENT

This application priority under 35 U.S.C. §119 to Korean Patent Application No. 10-2007-0098026 and 10-2008-0090880, filed Sep. 28, 2007 and Sep. 17, 2008, respectively, in the Korean Intellectual Property Office (KIPO), the entire contents of which are herein incorporated by reference.

BACKGROUND

1. Field

Example Embodiments relate to a semiconductor device and methods of fabricating the same, and more particularly, to a stacked memory module including a plurality of printed circuit boards (PCBs) on which memory devices are mounted, a method of fabricating the module, and an electronic system using the module.

2. Description of Related Art

In general, a large number of electronic systems, such as computers, use mainboards and memory modules as components. A memory module may include a plurality of memory devices mounted on a printed circuit board (PCB). In order to increase the memory capacity of the memory module, a method of increasing the number of the memory devices mounted on a single PCB or a method of increasing the capacity of each of the memory devices may be employed.

The method of increasing the capacity of each of the memory devices may involve developments of new process techniques of elevating integration density and an increase of new equipment, thereby increasing fabrication costs and risk bearing. On the other hand, a vast amount of research has been conducted on the method of increasing the number of the memory devices mounted on the single PCB because the method is relatively advantageous in terms of cost. An example of the method of increasing the number of the memory devices has been disclosed in U.S. Pat. No. 6,021,048 entitled "High Speed Memory Module" by Smith.

Conventionally, a plurality of memory modules are formed and connected to each other using an additional connection device. In this case, the connection device requires high endurance and reliability and an advanced joining technique. In other words, a malfunction may occur due to a defect in the connection device, thereby sharply lowering production efficiency. Furthermore, owing to the thicknesses of respective memory modules and the thickness of the connection device, only a limited number of memory modules may be connected to one another.

SUMMARY

Example embodiments provide a high-capacity stacked semiconductor module that may facilitate mass production.

Example embodiments also provide an electronic system adopting a stacked semiconductor module.

Furthermore, example embodiments provide a method of fabricating a high-capacity stacked semiconductor module, which may facilitate mass production.

A stacked semiconductor module, in accordance with example embodiments, may include a first semiconductor module with a rigid printed circuit board (PCB). A plurality of first semiconductor devices may be mounted on the rigid PCB. The rigid PCB may have a first surface and an oppositely facing second surface. According to example embodiments, a number L of first tabs may be on the first surface, and a number K of second tabs are on the second surface. A stacked semiconductor module, in accordance with example embodiments, may also include a second semiconductor module adjacent to the second surface of the rigid PCB. The second semiconductor module may include a first flexible PCB and a plurality of second semiconductor devices mounted on the first flexible PCB. The first flexible PCB may have a third surface and an oppositely facing fourth surface. In accordance with example embodiments, a number M of third tabs may be on the third surface, and a number N of fourth tabs may be on the fourth surface. In accordance with example embodiments, a first conductive adhesive may be between the second tabs and the third tabs and each of K, L, M, and N may be an integer ranging from 2 to 1000. In accordance with example embodiments, the third tabs may be electrically connected to corresponding ones of the second tabs.

An electronic system, in accordance with example embodiments, may include an electronic board and the above described stacked semiconductor module.

In accordance with example embodiments, a stacked module may include a first module and a second module. The first module may include a rigid printed circuit board with first tabs and a first plurality of semiconductor devices connected to the rigid printed circuit board. The second module may include a flexible printed circuit board with inner tabs and outer tabs and a second plurality of semiconductor devices connected to the flexible printed circuit board. In accordance with example embodiments, the flexible printed circuit board may be connected to the rigid printed circuit board.

BRIEF DESCRIPTION OF THE DRAWINGS

Example embodiments will be more clearly understood from the following detailed description taken in conjunction with the accompanying drawings.

FIG. 1 is a partial perspective view of an electronic system having a stacked semiconductor module and an electronic board according to example embodiments;

FIG. 2 is a plan view of one surface of a stacked semiconductor module according to example embodiments;

FIG. 3 is a cross-sectional view taken along line I-I' of FIG. 2, which illustrate a stacked semiconductor module according to an example embodiment;

FIGS. 4 through 9 are detailed enlarged views of a portion "Te" of FIG. 2, which illustrate the stacked semiconductor module shown in FIG. 3;

FIG. 10 is a cross-sectional view taken along line II-II' of FIG. 4;

FIG. 11 is a cross-sectional view taken along line III-III' of FIG. 4;

FIG. 12 is a cross-sectional view taken along line I-I' of FIG. 2, which illustrates a stacked semiconductor module according to another example embodiment;

FIGS. 13 through 16 are detailed enlarged views of a portion "Te" of FIG. 2, which illustrate the stacked semiconductor module shown in FIG. 12;

FIG. 17 is a cross-sectional view taken along line II-II' of FIG. 4, which illustrates the stacked semiconductor module shown in FIG. 12;

FIG. 18 is a cross-sectional view taken along line III-III' of FIG. 4, which illustrates the stacked semiconductor module shown in FIG. 12;

FIGS. 19 and 20 are cross-sectional views taken along line I-I', which illustrate stacked semiconductor modules according to other example embodiments; and FIGS. 21 through 24 are cross-sectional views illustrating a method of fabricating a stacked semiconductor module according to yet another example embodiment.

DETAILED DESCRIPTION OF THE EMBODIMENTS

Figure 1:
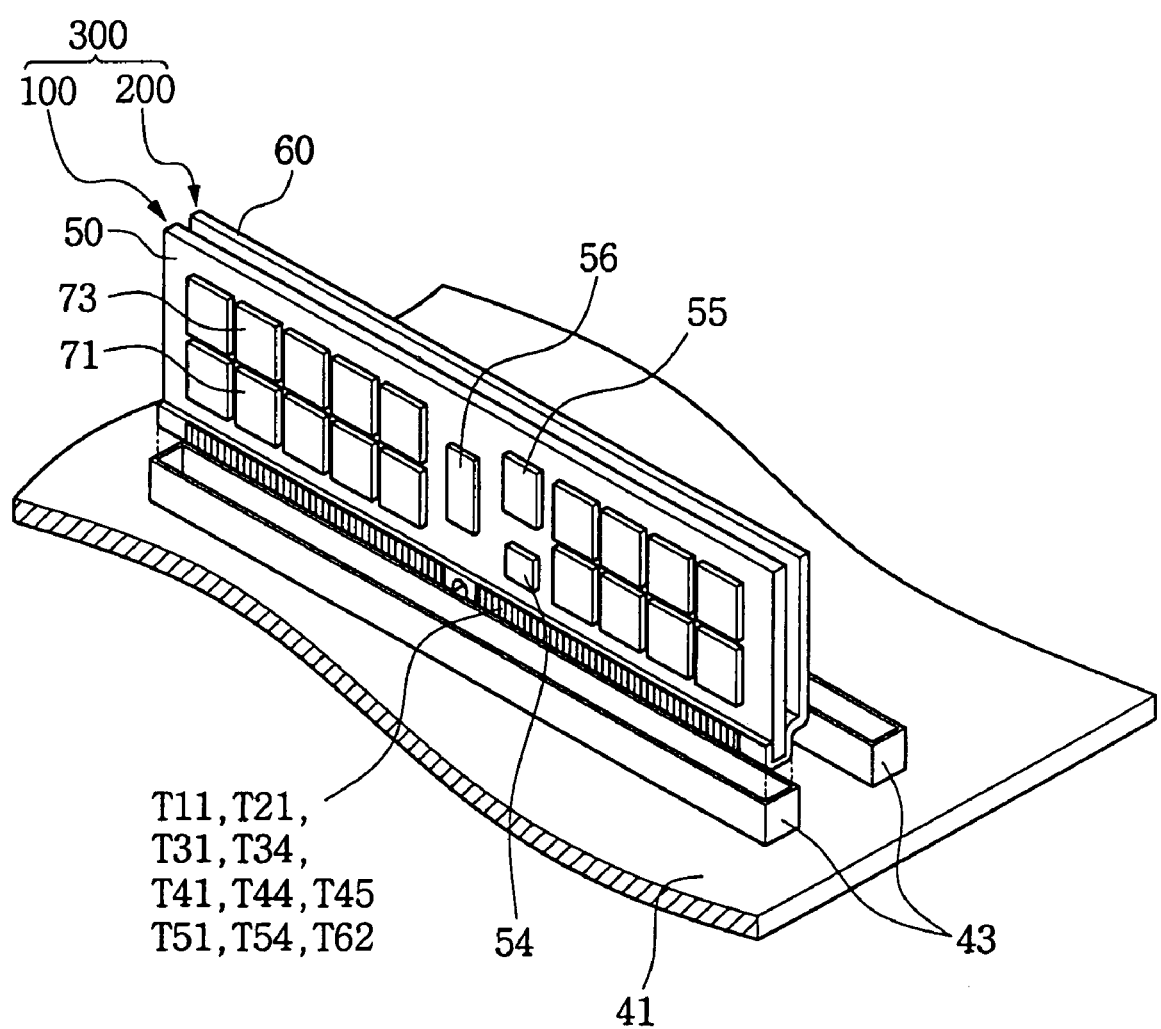
FIGS. 1-24 represent non-limiting, example embodiments as described herein.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 2:
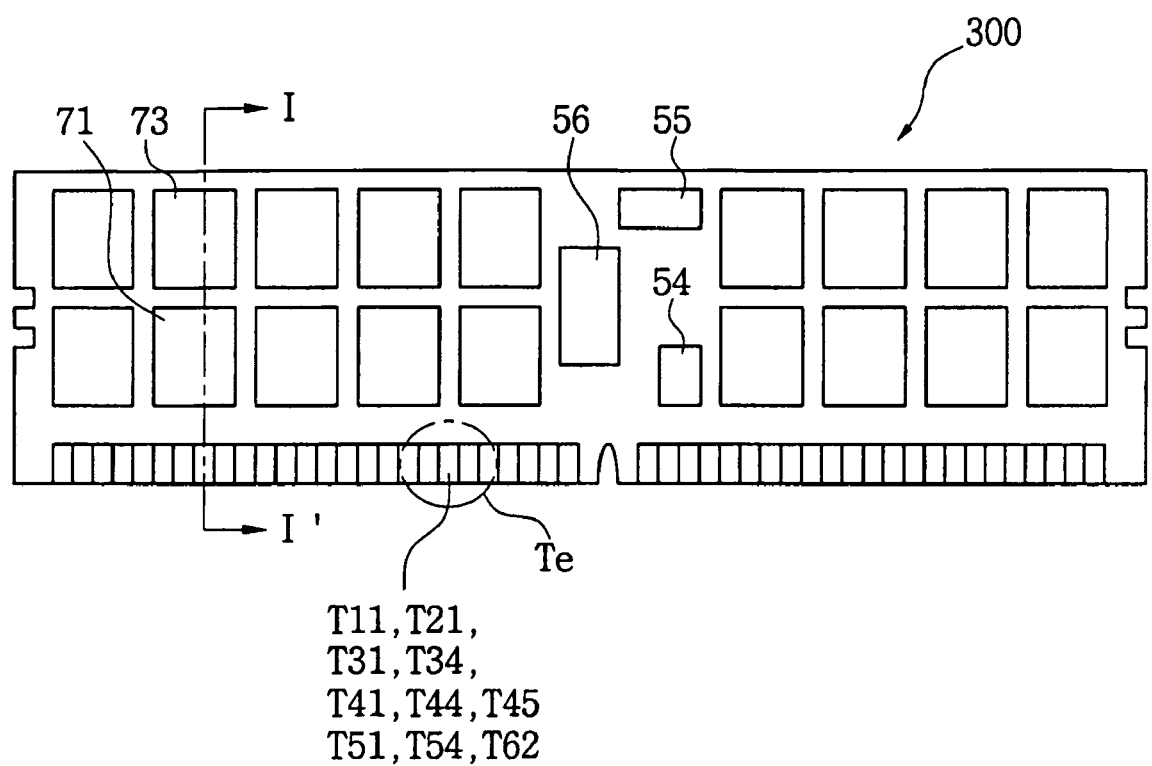

FIG. 1 is a partial perspective view of an electronic system including a stacked semiconductor module and an electronic board according to example embodiments. FIG. 2 is a plan view of one surface of a stacked semiconductor module according to example embodiments.

Referring to FIGS. 1 and 2, the electronic system according to the example embodiments may include an electronic board 41, a stacked semiconductor module 300, and connectors 43. The connectors 43 may be mounted on the electronic board 41 and may function to electrically connect the stacked semiconductor module 300 with the electronic board 41. For example, the electronic board 41 may be a mainboard for a personal computer.

The stacked semiconductor module 300 may include a first semiconductor module 100 and a second semiconductor module 200. The first semiconductor module 100 may include a rigid printed circuit board (PCB) 50 and a plurality of semiconductor devices 71 and 73. The semiconductor devices 71 and 73 may be regularly mounted on one surface or both surfaces of the rigid PCB 50. A register 56, a phase-locked loop (PLL) 55, and/or an additional logic chip 54 may also be mounted on the rigid PCB 50. The register 56, the PLL 55, and the additional logic chip 54 may be selectively mounted or selectively omitted.

The second semiconductor module 200 may include a flexible PCB 60 and other semiconductor devices (not shown). Although the register 56, the PLL 55, and the additional logic chip 54 may be selectively mounted also on the flexible PCB 60, a description thereof will be omitted for brevity.

The rigid PCB 50 and the flexible PCB 60 may include tabs T11, T21, T31, T34, T41, T44, T45, T51, T54, and T62 at their end. The tabs T11, T21, T31, T34, T41, T44, T45, T51, T54, and T62 may be formed of copper (Cu), tungsten (W), tungsten nitride (WN), titanium (Ti), titanium nitride (TiN), tantalum (Ta), tantalum nitride (TaN), gold (Au), and/or a combination thereof. For example, the tabs T11, T21, T31, T34, T41, T44, T45, T51, T54, and T62 may be formed by coating Au on a Cu surface. The semiconductor devices 71 and 73, the other semiconductor devices, the register 56, the PLL 55, and the additional logic chip 54 may be electrically connected in series or parallel with the tabs T11, T21, T31, T34, T41, T44, T45, T51, T54, and T62.

The flexible PCB 60 may bend or fold to contact the rigid PCB 50. For example, a portion of the flexible PCB 60 may wrap an end portion of the rigid PCB 50. In this case, the tabs T11, T21, T31, T34, T41, T44, T45, T51, T54, and T62 may be partially exposed at an end portion of the stacked semiconductor module 300. The stacked semiconductor module 300 may be inserted into each of the connectors 43. The semiconductor devices 71 and 73 and the other semiconductor devices may be electrically connected to the electronic board 41 by the tabs T11, T21, T31, T34, T41, T44, T45, T51, T54, and T62 and the connectors 43.

The semiconductor devices 71 and 73 and the other semiconductor devices may be memory devices. For example, the first semiconductor module 100 and/or the second semiconductor module 200 may be memory modules. The semiconductor devices 71 and 73 may be mounted in equal numbers. For example, the semiconductor devices 71 and 73 may be mounted in equal number to 4, 8, 9, 16, 18, or a multiple thereof on the rigid PCB 50, and other semiconductor devices may be mounted in equal number to 4, 8, 9, 16, 18, or a multiple thereof on the flexible PCB 60. Also, the stacked semiconductor module 300 may be a stacked memory module.

Example Embodiment 1

Figure 3:
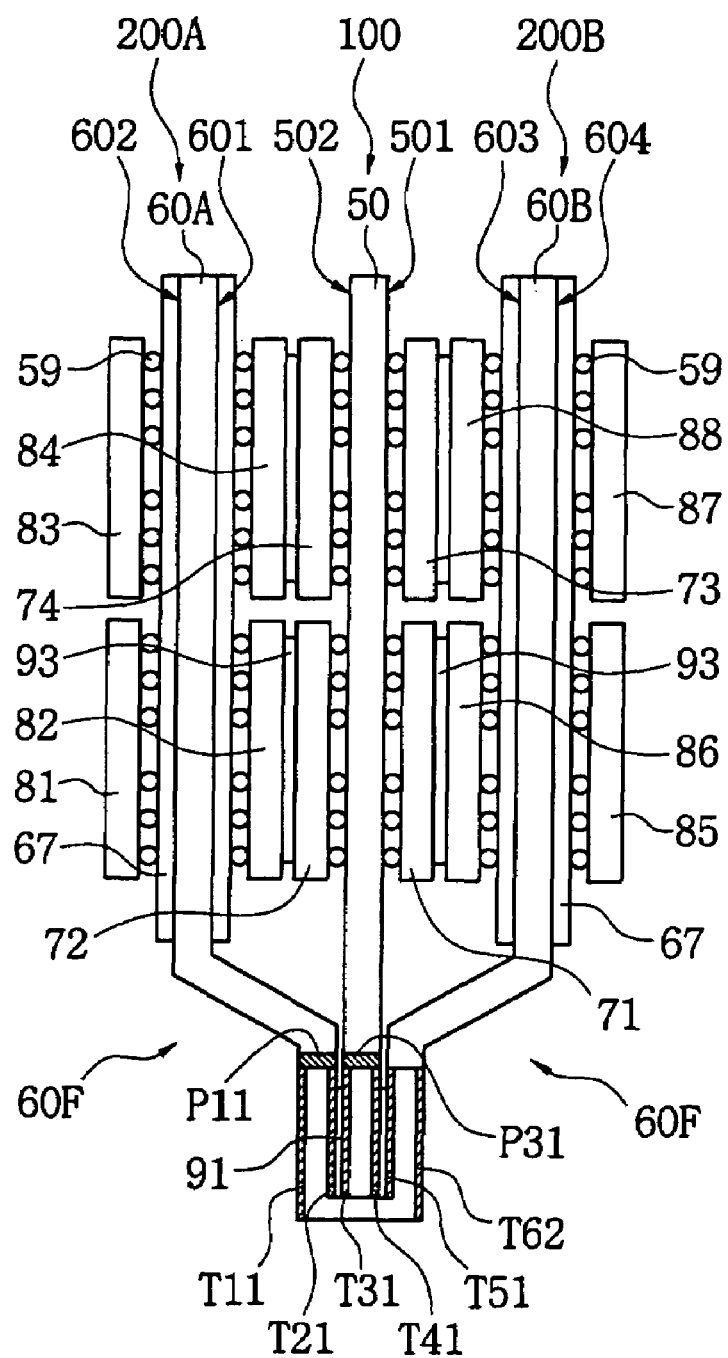
Figure 10:
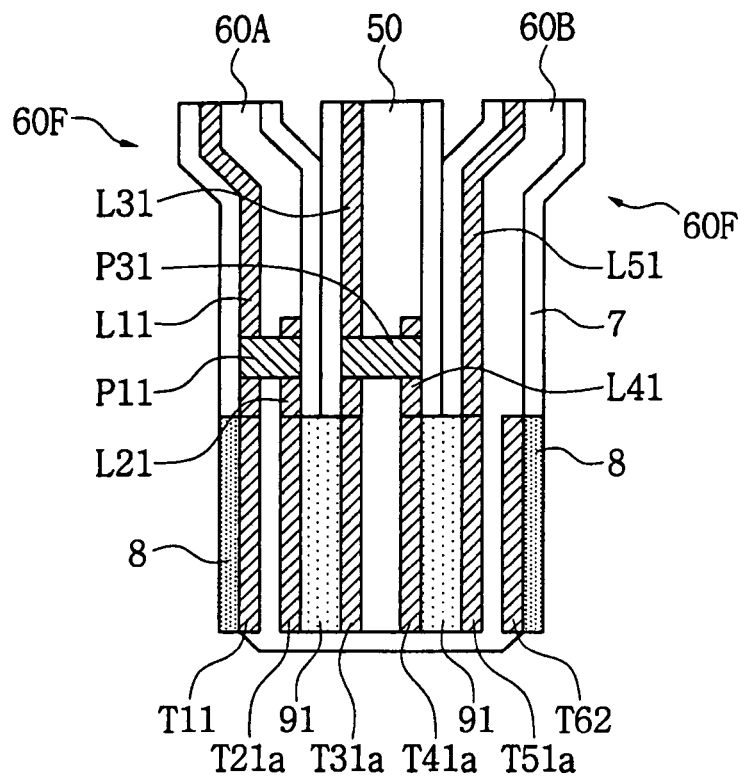
Figure 11:
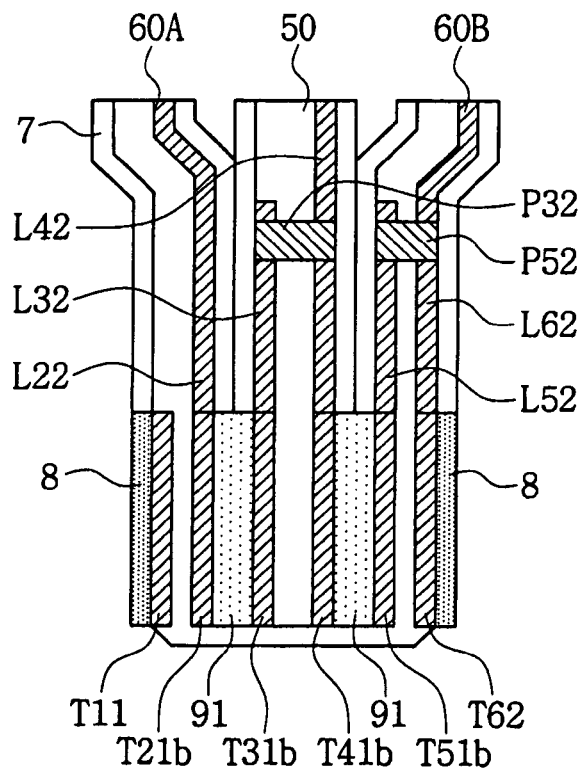

FIG. 3 is a cross-sectional view taken along line I-I' of FIG. 2, which illustrates a stacked semiconductor module according to an example embodiment. FIGS. 4 through 9 are detailed enlarged views of a portion "Te" of FIG. 2, which illustrate the stacked semiconductor module shown in FIG. 3. FIG. 10 is a cross-sectional view taken along line II-II' of FIG. 4. FIG. 11 is a cross-sectional view taken along line III-III' of FIG. 4.

Referring to FIG. 3, the stacked semiconductor module according to example embodiment 1 may include a first semiconductor module 100, a second semiconductor module 200A, and a third semiconductor module 200B.

The first semiconductor module 100 may include a rigid PCB 50 with first through fourth semiconductor devices 71, 72, 73, and 74. The rigid PCB 50 may include first via plugs P31 and first and second tabs T41 and T31. The semiconductor devices 71, 72, 73, and 74 may be mounted on the rigid PCB 50 using conductive connection units, for example, solder balls 59. The semiconductor devices 71, 72, 73, and 74 may be electrically connected to the first and second tabs T41 and T31 by the solder balls 59 and embedded interconnection lines (not shown) of the rigid PCB 50.

The rigid PCB 50 may have a first surface 501 on one face of the rigid PCB 50 and a second surface 502 on an opposite face of the rigid PCB 50. The first tabs T41 may be formed on the first surface 501 and the second tabs T31 may be formed on the second surface 502. The first and second tabs T41 and T31 may be formed across from each other at an end portion of the rigid PCB 50. The first via plugs P31 may be in contact with the first and second tabs T31 and T41 through the rigid PCB 50. The first via plugs P31 may be formed adjacent to the tabs T41 and T31 and between the semiconductor devices 71, 72, 73, and 74 and the tabs T41 and T31. The first via plugs P31 may be formed of Cu, W, WN, Ti, TiN, Ta, TaN, and/or a combination thereof.

The semiconductor devices 71, 72, 73, and 74 may be regularly mounted on one surface or both surfaces of the rigid PCB 50. For example, first and third semiconductor devices 71 and 73 may be mounted on the first surface 501 of the rigid PCB 50, while second and fourth semiconductor devices 72 and 74 may be mounted on the second surface 502 thereof.

The second and third semiconductor modules 200A and 200B may include flexible PCBs 60A and 60B and fifth through twelfth semiconductor devices 81, 82, 83, 84, 85, 86, 87, and 88. The flexible PCB 60A may have a third surface 601 on one face of the flexible PCB 60A and a fourth surface 602 on an opposite face of the flexible PCB 60A. The flexible PCB 60B may include a fifth surface 603 on one face of the flexible PCB 60B and a sixth surface 604 on opposite face of the flexible PCB 60B. Each of the flexible PCBs 60A and 60B may include a subsidiary board 67. The flexible PCBs 60A and 60B may include second via plugs P11 and third through sixth tabs T21, T11, T51, and T62.

The subsidiary board 67 may be formed using prepreg and/or Cu foil. The subsidiary board 67 may be partially bonded to each of the flexible PCBs 60A and 60B. The subsidiary board 67 may serve as a redistribution layer. Also, the subsidiary board 67 may function to reduce the bending effect of the flexible PCBs 60A and 60B. In other words, portions of the flexible PCBs 60A and 60B to which the subsidiary boards 67 are bonded may be stiffened. In this case, the flexible PCBs 60A and 60B may be called rigid-flexible PCBs. Portions of the flexible PCBs 60A and 60B on which the subsidiary boards 67 are not mounted may be defined as connection sections 60F. The connection sections 60F may easily bend. However, according to other example embodiments, the subsidiary board 67 may be omitted.

The flexible PCBs 60A and 60B may bend or fold to contact the rigid PCB 50. For example, the flexible PCBs 60A and 60B may bend to wrap an end portion of the rigid PCB 50. Also, each of the flexible PCBs 60A and 60B may overlap the rigid PCB 50. In other words, the flexible PCBs 60A and 60B may cover both surfaces of the rigid PCB 50. The fifth tabs T51 may face the first tabs T41, and the third tabs T21 may face the second tabs T31.

The flexible PCBs 60A and 60B may be bonded to the rigid PCB 50 using a conductive adhesive 91. The conductive adhesive 91 may include an anisotropic conductive film (ACF) or anisotropic conductive paste (ACP). The conductive adhesive 91 may be bonded between the fifth tabs T51 and the first tabs T41 and between the third tabs T21 and the second tabs T31. The conductive adhesive 91 may electrically connect the fifth tabs T51 with the first tabs T41 and electrically connect the third tabs T21 with the second tabs T31.

The third tabs T21 may be formed on the third surface 601, while the fourth tabs T11 may be formed on the fourth surface 602. In this example embodiment, the third tabs T21 and fourth tabs T11 may be formed across from on another on the flexible PCB 60A. Similarly, the fifth tabs T51 may be formed on the fifth surface 603, while the sixth tabs T62 may be formed on the sixth surface 604. In this example embodiment, the fifth and sixth tabs T51 and T62 may be formed across from one another on the flexible PCB 60B. The second via plugs P11 may be in contact with the third and fourth tabs T21 and T11 through the flexible PCB 60A. The second via plugs P11 may be formed adjacent to the tabs T21 and T11. The second via plugs P11 may also be formed between the semiconductor devices 81, 82, 83, and 84 and the tabs T21 and T11. The second via plugs P11 may be formed of Cu, W, WN, Ti, TiN, Ta, TaN, and/or a combination thereof.

The fifth through twelfth semiconductor devices 81, 82, 83, 84, 85, 86, 87, and 88 may be regularly mounted on one surface or both surfaces of the flexible PCBs 60A and 60B. For example, the sixth and eighth semiconductor devices 82 and 84 may be mounted on the third surface 601 of the flexible PCB 60A to face the second and fourth semiconductor devices 72 and 74, and the fifth and seventh semiconductor devices 81 and 83 may be mounted on the fourth surface 602 of the flexible PCB 60A across from the sixth and eighth semiconductor devices 82 and 84. Also, the tenth and twelfth semiconductor devices 86 and 88 may be mounted on the fifth surface 603 of the flexible PCB 60B to face first and third semiconductor devices 71 and 73, and the ninth and eleventh semiconductor devices 85 and 87 may be mounted on the sixth surface 604 of the flexible PCB 60B across from the tenth and twelfth semiconductor devices 86 and 88.

The fifth through twelfth semiconductor devices 81, 82, 83, 84, 85, 86, 87, and 88 may be mounted on the flexible PCBs 60A and 60B using conductive connection units, such as the solder balls 59. The fifth through twelfth semiconductor devices 81, 82, 83, 84, 85, 86, 87, and 88 may be electrically connected to the third through sixth tabs T21, T11, T51, and T62 by the solder balls 59 and embedded interconnection lines (not shown) of the flexible PCBs 60A and 60B.

The second and third semiconductor modules 200A and 200B may be bonded to the first semiconductor module 100 using an adhesive plate 93. For example, the adhesive plate 93 may be formed between the second semiconductor device 72 and the sixth semiconductor device 82 and between the fourth semiconductor device 74 and the eighth semiconductor device 84. Also, the adhesive plate 93 may be formed between the first semiconductor device 71 and the tenth semiconductor device 86 and between the third semiconductor device 73 and the twelfth semiconductor device 88. The adhesive plate 93 may be an adhesive tape functioning as a heat sink.

Figure 4:
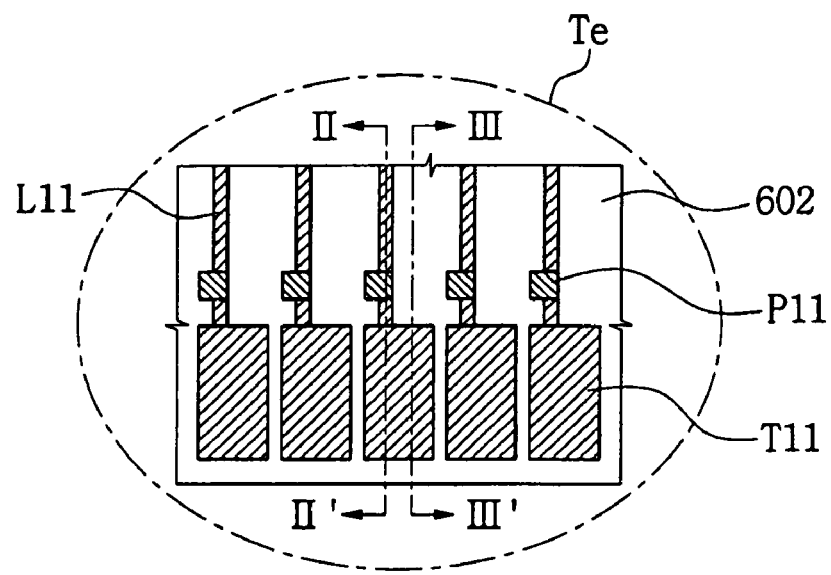

Referring to FIGS. 3 and 4, a number N of fourth tabs T11 may be formed on the fourth surface 602. Here, N may be an integer ranging from 2 to 1000. For example, one hundred and twenty fourth tabs T11 may be formed on the fourth surface 602. The fourth tabs T11 may be electrically connected to the fifth to eighth semiconductor devices 81, 82, 83, and 84 by internal interconnection lines L11. The second via plugs P11 may be in contact with the internal interconnection lines L11, respectively. The internal interconnection lines L11 may be formed of Cu, W, WN, Ti, TiN, Ta, TaN, and/or a combination thereof.

Figure 5:
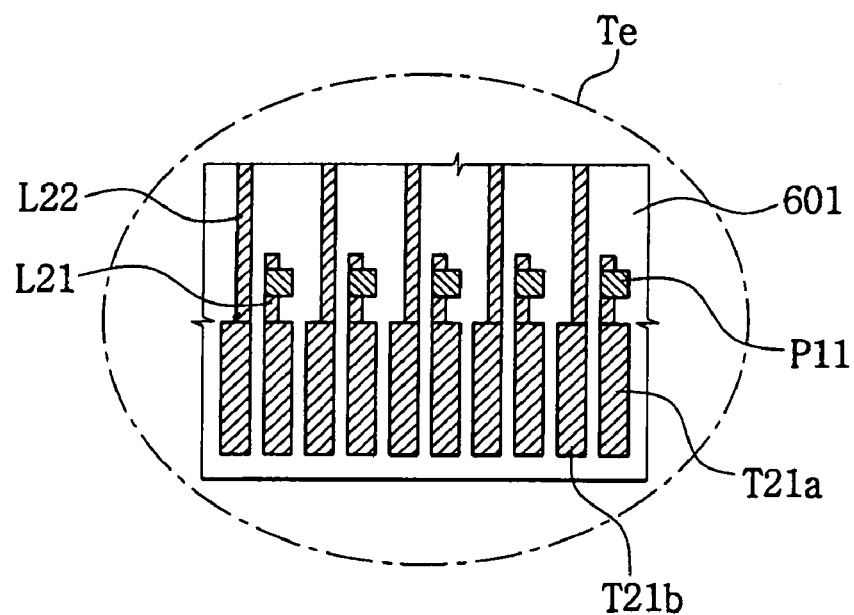

Referring to FIGS. 3 and 5, a number M of third tabs T21 may be formed on the third surface 601. The third tabs T21 may include a first group of third tabs T21a and a second group of third tabs T21b. Here, M may be an integer ranging from 2 to 1000, which may be larger than N. For instance, two hundred and forty third tabs T21 may be formed on the third surface 601. The first group third tabs T21a may be in contact with the second via plugs P11 through the internal interconnection lines L21. In other words, the first group of the third tabs T21a may be electrically connected to the fourth tabs T11 by the second via plugs P11. A second group of third tabs T21b may be electrically connected to the fifth through eighth semiconductor devices 81, 82, 83, and 84 by other internal interconnection lines L22. By way of example only, the second group of the third tabs T21b may include a number N of third tabs. For example, the second group of the third tabs T21b may include one hundred and twenty third tabs.

The first group of third tabs T21a and the second group of third tabs T21b may be arranged alternately on the third surface 601. The first group of the third tabs T21a may include third tabs in equal number to the fourth tabs T11. By way of example only, the first group of third tabs T21a may include a number N of third tabs. For example, first group of third tabs T21a may include one hundred and twenty third tabs. A pitch between the first group of third tabs T21a and the second group of third tabs T21b may be smaller than a pitch between the fourth tabs T11. In other words, the width of the tabs in the first group of third tabs T21a and the width of the tabs in the second group of third tabs T21b may be smaller than that of the fourth tabs T11.

Figure 6:
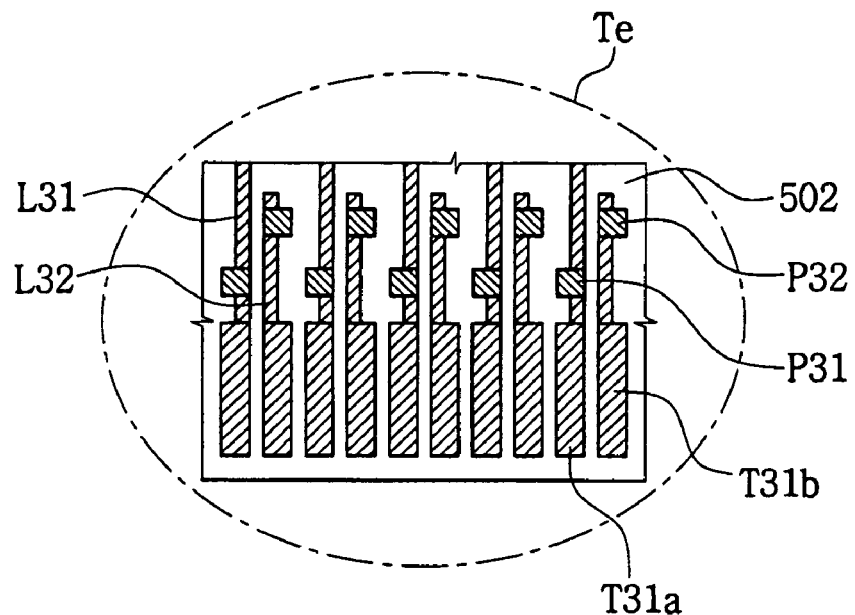

Referring to FIGS. 3 and 6, a number K of second tabs T31 may be formed on the second surface 502. Here, K may be an integer ranging from 2 to 1000, which may be larger than N. Also, K may be equal to M. For instance, two hundred and forty second tabs T31 may be formed on the second surface 502. The second tabs T31 may include a first group second tabs T31a and a second group of second tabs T31b. The first group of second tabs T31a may be electrically connected to the first through fourth semiconductor devices 71, 72, 73, and 74 by internal interconnection lines L31. The first group of the second tabs T31a may be connected to the first via plugs P31 by the internal interconnection lines L31. The second group of the second tabs T31b may be in contact with third via plugs P32 through other internal interconnection lines L32. The second group of the second tabs T31b may include second tabs in equal number to the second group of third tabs T21b.

The tabs of the first group of second tabs T31a and the tabs of the second group of second tabs T31b may be arranged alternately on the second surface 502. The first group of the second tabs T31a may include second tabs in equal number to the fourth tabs T11. For example, the first group of second tabs T31a may include a number N of second tabs. Therefore, first group T31a may include one hundred and twenty second tabs. A pitch between the tabs of the first group of second tabs T31a and the tabs of the second group of second tabs T31b may be equal to a pitch between the tabs of the first group of third tabs T21a and the second group of third tabs T21b. In other words, the width of the second tabs in groups T31a and T31b may be equal to that of the third tabs in groups T21a and T21b.

Figure 7:
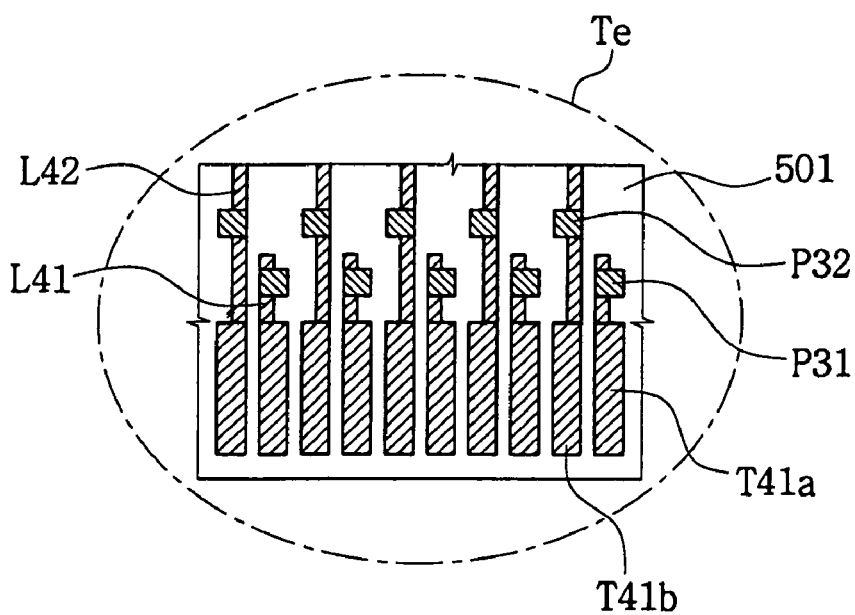

Referring to FIGS. 3 and 7, a number L of first tabs T41 may be formed on the first surface 501. Here, L may be an integer ranging from 2 to 1000, which may be larger than N. Also, L may be equal to K. In addition, L may be equal to M. For example, two hundred and forty first tabs T41 may be formed on the first surface 501. The first tabs T41 may include a first group of first tabs T41a and a second group of first tabs T41b. A first group of the first tabs T41a may be connected to the first via plugs P31 by internal interconnection lines L41. A second group of the first tabs T41b may be electrically connected to the first through fourth semiconductor devices 71, 72, 73, and 74 by other internal interconnection lines L42. The second group of the first tabs T41b may be in contact with the third via plugs P32 through the internal interconnection lines L42. The second group of the first tabs T41b may include first tabs in equal number to the second tabs of the second group of second tabs T31b. The second group of the first tabs T41b may be electrically connected to the second group of the second tabs T31b by the third via plugs P32.

The first tabs of the first group T41a and the first tabs of the second group T41b may be arranged alternately on the first surface 501. The first group of the first tabs T41a may include first tabs in equal number to the fourth tabs T11. For example, the first group T41a may include a number N of first tabs. Therefore, the first group T41a may include one hundred and twenty first tabs. A pitch between the tabs of the first group of first tabs T41a and the tabs of the second group of first tabs T41b may be equal to a pitch between the second tabs in groups T31a and T31b. In other words, the width of the tabs of the first group of first tabs T41a and the width of the tabs of the second group of first tabs T41b may be equal to that of the second tabs in groups T31a and T31b.

Figure 8:
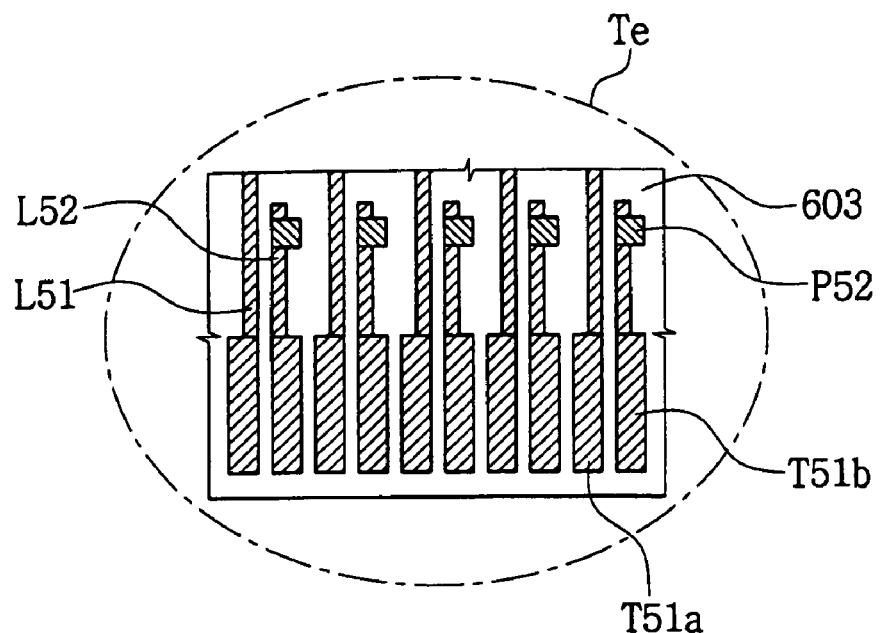

Referring to FIGS. 3 and 8, a number G of fifth tabs T51 may be formed on the fifth surface 603. Here, G may be an integer ranging from 2 to 1000, which may be larger than N. Also, G may be equal to L. In addition, G may be equal to K. Furthermore, G may be equal to M. For example, two hundred and forty fifth tabs T51 may be formed on the fifth surface 603. The fifth tabs T51 may include a first group of fifth tabs T51a and a second group of fifth tabs T51b. The first group of the fifth tabs T51a may be electrically connected to the ninth through twelfth semiconductor devices 85, 86, 87, and 88 by internal interconnection lines L51. The second group of the fifth tabs T51b may be connected to fourth via plugs P52 by other internal interconnection lines L52. The second group of the fifth tabs T51b may include fifth tabs in equal number to the first tabs of the second group of the first tabs T41b.

The fifth tabs in groups T51a and T51b may be arranged alternately on the fifth surface 603. The first group of the fifth tabs T51a may include fifth tabs in equal number to the fourth tabs T11. For example, the first group T51a may include a number N of fifth tabs. Therefore, the first group T51a may include 120 fifth tabs. A pitch between the fifth tabs in groups T51a and T51b may be equal to a pitch between the first tabs in groups T41a and T41b. In other words, the width of the fifth tabs in groups T51a and T51b may be equal to that of the first tabs in groups T41a and T41b.

Figure 9:
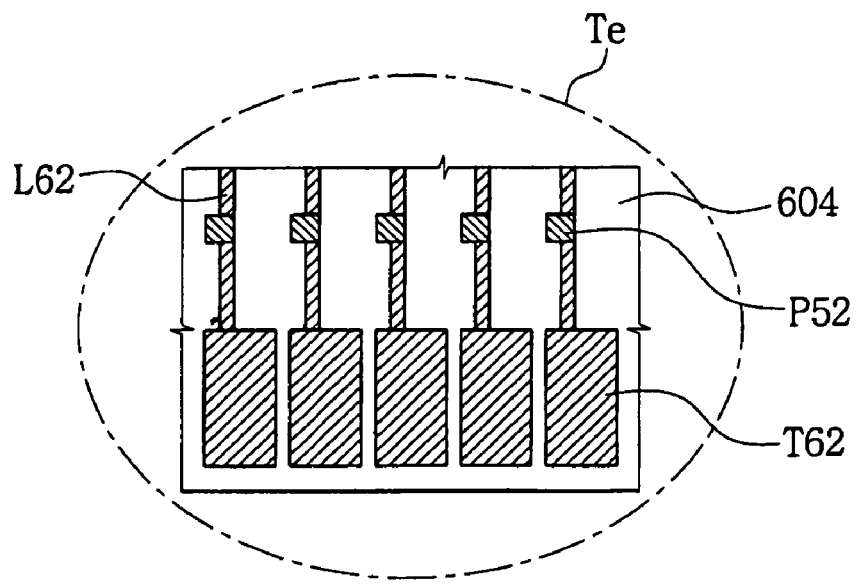

Referring to FIGS. 3 and 9, a number H of sixth tabs T62 may be formed on the sixth surface 604. Here, H may be an integer ranging from 2 to 1000. For example, one hundred and twenty sixth tabs T62 may be formed on the sixth surface 604. The sixth tabs T62 may be electrically connected to the ninth to twelfth semiconductor devices 85, 86, 87, and 88 by internal interconnection lines L62. The fourth via plugs P52 may be in contact with the internal interconnection lines L62. The sixth tabs T62 may be electrically connected to the second group of the fifth tabs T51b by the fourth via plugs P52. A pitch between the sixth tabs T62 may be equal to a pitch between the fourth tabs T11.

Referring to FIGS. 3, 4, and 10, the first group of the first tabs T41a may be electrically connected to the first group of the second tabs T31a via the first via plugs P31 formed through the rigid PCB 50. The first group of the third tabs T21a may be electrically connected to the fourth tabs T11 via the second via plugs P11 formed through the flexible PCB 60A. The first group of the third tabs T21a may be electrically connected to the first group of the second tabs T31a by the conductive adhesive 91. The first group of the first tabs T41a may be electrically connected to the first group of the fifth tabs T51a by the conductive adhesive 91. As a result, the fourth tabs T11 may be electrically connected to the first through twelfth semiconductor devices 71, 72, 73, 74, 81, 82, 83, 84, 85, 86, 87, and 88 via the first and second via plugs P31 and P11, the conductive adhesive 91, and the internal interconnection lines L11, L21, L31, L41, and L51.

The surfaces of the rigid PCB 50 and the flexible PCBs 60A and 60B may be covered with an insulating layer 7. The surfaces of the fourth tabs T11 and the sixth tabs T62 may be covered with a conductive layer with low corrosiveness and oxidation properties, for example, an Au layer 8.

Referring to FIGS. 3, 4, and 11, the second group of the first tabs T41b may be electrically connected to the second group of the second tabs T31b via the third via plugs P32 formed through the rigid PCB 50. The second group of the fifth tabs T51b may be electrically connected to the sixth tabs T62 via the fourth via plugs P52 formed through the flexible PCB 60B. The second group of the third tabs T21b may be electrically connected to the second group of the second tabs T31b by the conductive adhesive 91. The second group of the first tabs T41b may be electrically connected to the second group of the fifth tabs T51b by the conductive adhesive 91. As a result, the sixth tabs T62 may be electrically connected to the first through twelfth semiconductor devices 71, 72, 73, 74, 81, 82, 83, 84, 85, 86, 87, and 88 via the third and fourth via plugs P32 and P52, the conductive adhesive 91, and the internal interconnection lines L22, L32, L42, L52, and L62.

Referring again to FIGS. 2 through 11, the stacked semiconductor module according to Example embodiment 1 may be a double-data-rate two (DDR-2) memory module. In this case, the first through twelfth semiconductor devices 71, 72, 73, 74, 81, 82, 83, 84, 85, 86, 87, and 88 may be memory devices, such as dynamic random access memory (DRAM) devices. Also, the first through twelfth semiconductor devices 71, 72, 73, 74, 81, 82, 83, 84, 85, 86, 87, and 88 may be single memory chips or multi-chip packages (MCPs). Each of the flexible PCBs 60A and 60B may be thinner than the rigid PCB 50. For example, the rigid PCB 50 may have a thickness of about 0.6 mm, and each of the flexible PCBs 60A and 60B may have a thickness of about 0.3 mm.

One hundred and twenty fourth tabs T11 and one hundred and twenty sixth tabs T62 may be provided, and two hundred and forty first tabs T41, two hundred and forty second tabs T31, two hundred and forty third tabs T21, and two hundred and forty fifth tabs T51 may be provided. Also, each of the first group of the first tabs T41a, the second group of the first tabs T41b, the first group of the second tabs T31a, the second group of the second tabs T31b, the first group of the third tabs T21a, the second group of the third tabs T21b, the first group of the fifth tabs T51a, and the second group of the fifth tabs T51b may include two hundred and twenty tabs.

The fourth tabs T11, the first group of the third tabs T21a, the first group of the second tabs T31a, the first group of the first tabs T41a, and the first group of the fifth tabs T51a may be electrically connected to one another by the first and second via plugs P31 and P11 and the conductive adhesive 91. Similarly, the sixth tabs T62, the second group of the fifth tabs T51b, the second group of the first tabs T41b, the second group of the second tabs T31b, and the second group of the third tabs T21b may be electrically connected to one another by the third and fourth via plugs P32 and P52 and the conductive adhesive 91.

As a result, the fourth tabs T11 may be electrically connected to the first through twelfth semiconductor devices 71, 72, 73, 74, 81, 82, 83, 84, 85, 86, 87, and 88 via the first and second via plugs P31 and P11), the conductive adhesive 91, and the internal interconnection lines L11, L21, L31, L41, and L51. Also, the sixth tabs T62 may be electrically connected to the first through twelfth semiconductor devices 71, 72, 73, 74, 81, 82, 83, 84, 85, 86, 87, and 88 via the third and fourth via plugs P32 and P52, the conductive adhesive 91, and the internal interconnection lines L22, L32, L42, L52, and L62.

The first through fourth via plugs P31, P11, P32, and P52 may be formed adjacent to the first through sixth tabs T11, T21, T31, T41, T51, and T62. The first through fourth via plugs P31, P11, P32, and P52 may greatly shorten electrical connection paths between the first through twelfth semiconductor devices 71, 72, 73, 74, 81, 82, 83, 84, 85, 86, 87, and 88 and the fourth tabs T11 and electrical connection paths between the first through twelfth semiconductor devices 71, 72, 73, 74, 81, 82, 83, 84, 85, 86, 87, and 88 and the sixth tabs T62. According to Example embodiment 1 as described above, a high-capacity stacked memory module can be embodied.

Example Embodiment 2

Figure 12:
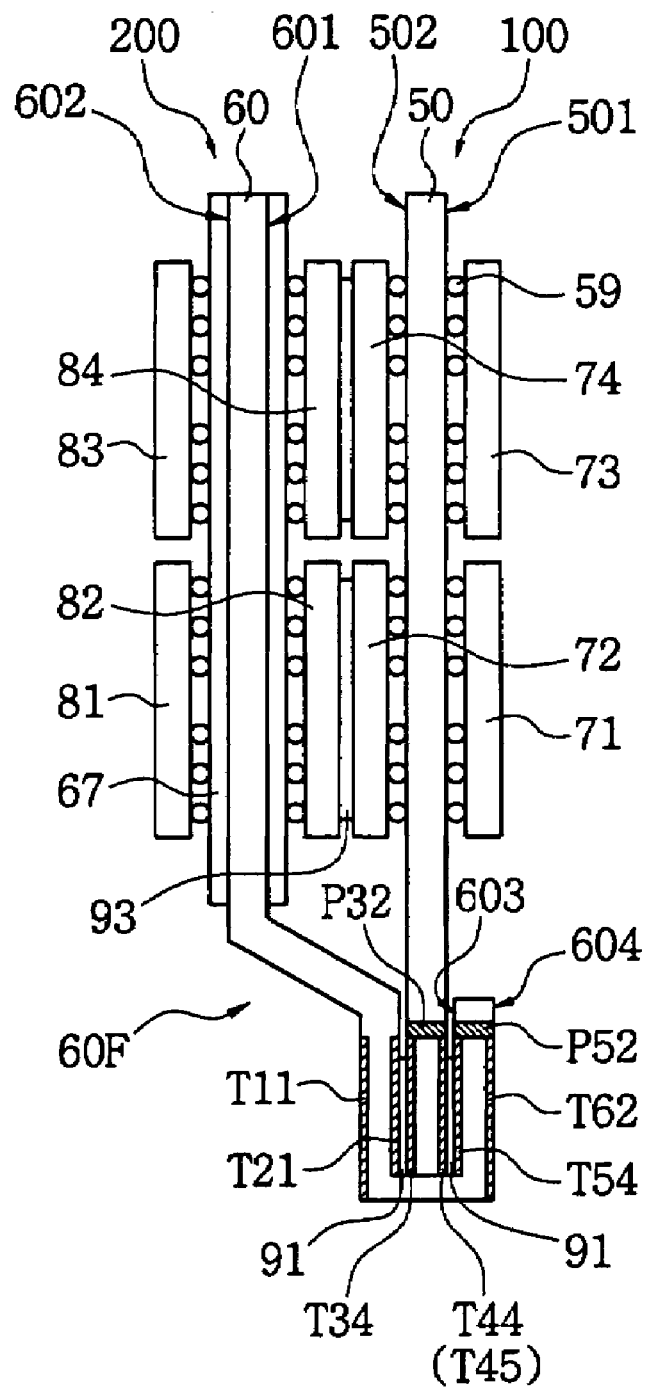
Figure 17:
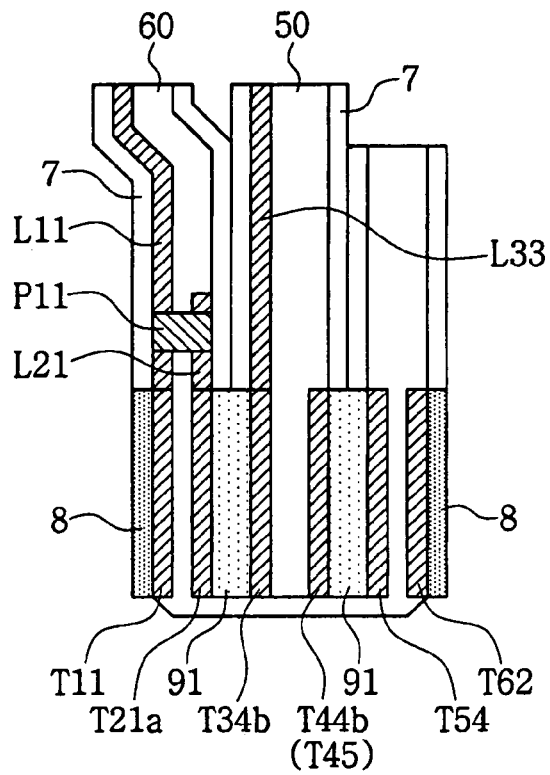
Figure 18:
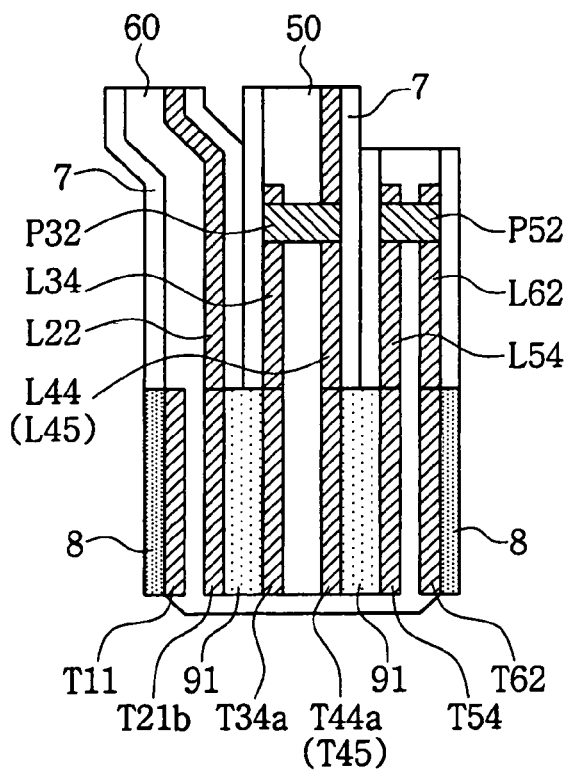

FIG. 12 is a cross-sectional view taken along line I-I' of FIG. 2, which illustrates a stacked semiconductor module according to another example embodiment. FIGS. 13 through 16 are detailed enlarged views of a portion "Te" of FIG. 2, which illustrate the stacked semiconductor module shown in FIG. 12. FIG. 17 is a cross-sectional view taken along line II-II' of FIG. 4, which illustrates the stacked semiconductor module shown in FIG. 12. FIG. 18 is a cross-sectional view taken along line III-III' of FIG. 4, which illustrates the stacked semiconductor module shown in FIG. 12.

Referring to FIG. 12, the stacked semiconductor module according to example embodiment 2 may include a first semiconductor module 100 and a second semiconductor module 200. For brevity, the same description as in Example embodiment 1 will be omitted.

The first semiconductor module 100 may include a rigid PCB 50 and first through fourth semiconductor devices 71, 72, 73, and 74. The rigid PCB 50 may include third via plugs P32 and first and second tabs T44, T45, and T34. The semiconductor devices 71, 72, 73, and 74 may be electrically connected to the tabs T44, T45, and T34 by solder balls 59 and embedded interconnection lines (not shown) of the rigid PCB 50.

The rigid PCB 50 may have a first surface 501 on one face of the rigid PCB 50 and a second surface 502 on an opposite face of the rigid PCB 50. The third via plugs P32 may be in contact with the first and second tabs T44, T45, and T34 through the rigid PCB 50. The third via plugs P32 may be formed adjacent to the tabs T44, T45, and T34 between the semiconductor devices 71, 72, 73, and 74 and the tabs T44, T45, and T34. The third via plugs P32 may be formed of Cu, W, WN, Ti, TiN, Ta, TaN, and/or a combination thereof.

The second semiconductor module 200 may include a flexible PCB 60 and fifth through eighth semiconductor devices 81, 82, 83, and 84. The flexible PCB 60 may include a third surface 601 and a fourth surface 602, which are on opposite faces of the flexible PCB 60, and a fifth surface 603 and a sixth surface 604, which are on opposite faces of the flexible PCB 60. The flexible PCB 60 may include a subsidiary board 67. The flexible PCB 60 may include fourth via plugs P52 and third through sixth tabs T21, T11, T54, and T62. The subsidiary board 67 may be formed using prepreg and Cu foil. However, according to other example embodiments, the subsidiary board 67 may be omitted.

The flexible PCB 60 may bend or fold to contact the rigid PCB 50. For example, the flexible PCB 60 may fold to wrap an end portion of the rigid PCB 50. Also, the flexible PCB 60 may overlap the rigid PCB 50. The flexible PCB 60 may be bonded to the rigid PCB 50 using a conductive adhesive 91. The conductive adhesive 91 may include an ACF or ACP. The conductive adhesive 91 may be bonded between the fifth tabs T54 and the first tabs T44 and T45 and between the third tabs T21 and the second tabs T34. The conductive adhesive 91 may electrically connect the fifth tabs T54 with the first tabs T44 and T45 and electrically connect the third tabs T21 with the second tabs T34.

The fourth via plugs P52 may be in contact with the fifth and sixth tabs T54 and T62 through the flexible PCB 60. The fourth via plugs P52 may be formed adjacent to the fifth and sixth tabs T54 and T62. The fourth via plugs P52 may be formed of Cu, W, WN, Ti, TiN, Ta, TaN, and/or a combination thereof.

The fifth through eighth semiconductor devices 81, 82, 83, and 84 may be mounted on the flexible PCB 60 using conductive connection units, such as the solder balls 59. The second semiconductor module 200 may be bonded to the first semiconductor module 100 using an adhesive plate 93. The adhesive plate 93 may be an adhesive tape functioning as a heat sink.

Figure 13:
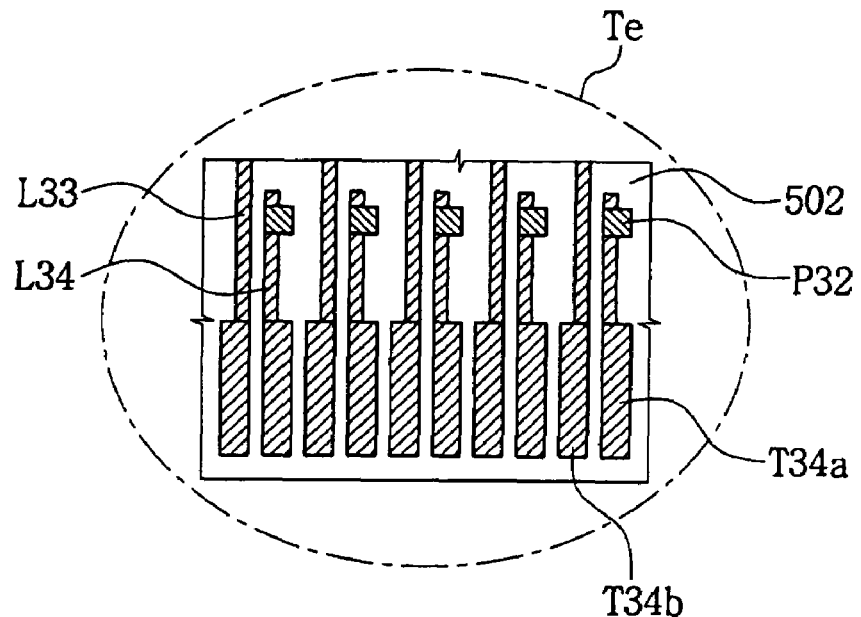

Referring to FIGS. 12 and 13, a number N of fourth tabs T11, internal interconnection lines L11, and second via plugs P11, which are the same as described with reference to FIG. 4, may be formed on the fourth surface 602. Here, N may be an integer ranging from 2 to 1000. A number M of third tabs T21, internal interconnection lines L21 and L22, and second via plugs P11, which are the same as described with reference to FIG. 5, may be formed on the third surface 601, wherein the groups T21a and T21b are different groups of third tabs T21. Here, M may be an integer ranging from 2 to 1000, which may be larger than N.

A number K of second tabs T34 may be formed on the second surface 502. The second tabs T34 may include a first group of second tabs T34b and a second group of second tabs 34a. Here, K may be an integer ranging from 2 to 1000, which may be larger than N. Also, K may be equal to M. For instance, two hundred and forty second tabs T34 may be formed on the second surface 502. The first group of the second tabs T34b may be electrically connected to the first through fourth semiconductor devices 71, 72, 73, and 74 by internal interconnection lines L33. A second group of the second tabs T34a may be in contact with the third via plugs P32 through other internal interconnection lines L34. The second group of the second tabs T34a may include second tabs in equal number to the third tabs of the second group of the third tabs T21b.

The first group of second tabs T34b and the second group of second tabs T34a may be arranged alternately one by one on the second surface 502. The first group of the second tabs T34b may include second tabs in equal number to the fourth tabs T11. For example, the first group T34b may include a number N of second tabs. Therefore, the first group T34b may include one hundred and twenty second tabs. A pitch between the second tabs T34 may be equal to a pitch between the third tabs T21. In other words, the width of the second tabs in groups T34a and T34b may be equal to the width of the tabs in groups T21a and T21b.

Figure 14:
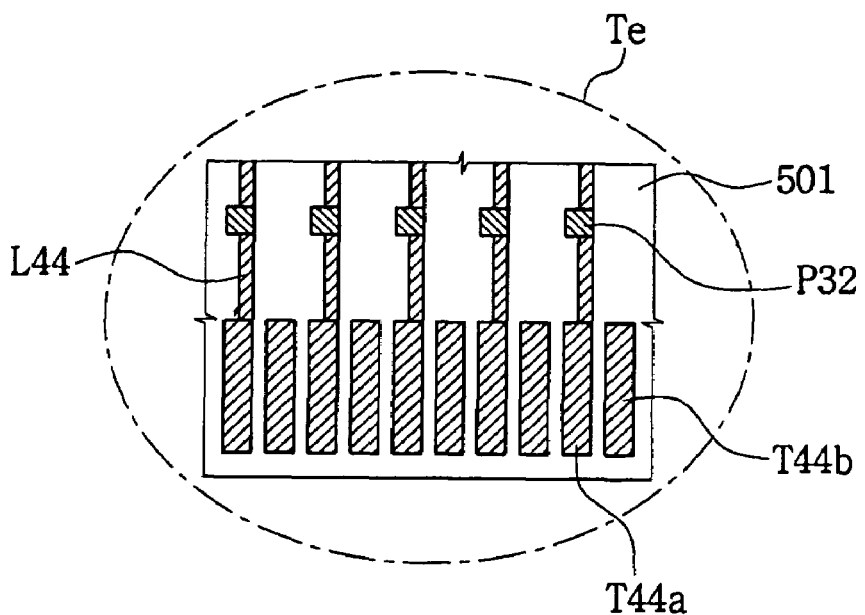

Referring to FIGS. 12 and 14, a number L of first tabs T44 may be formed on the first surface 501. The first tabs T44 may include a first group of first tabs T44b and a second group of first tabs T44a. Here, L may be an integer ranging from 2 to 1000, which may be larger than N. Also, L may be equal to K. In addition, L may be equal to M. For example, two hundred and forty first tabs T44 may be formed on the first surface 501. A second group of the first tabs T44a may be electrically connected to the first through fourth semiconductor devices 71, 72, 73, and 74 by internal interconnection lines L44. The second group of the first tabs T44a may be in contact with the third via plugs P32 through the internal interconnection lines L44. The second group of the first tabs T44a may include first tabs in equal number to the second tabs of the second group of the second tabs T34a. The second group of the first tabs T44a may be electrically connected to the second group of the second tabs T34a by the third via plugs P32.

The first tabs of a first group T44b and the first tabs of the second group T44a may be arranged alternately one by one on the first surface 501. The first group of the first tabs T44b may include first tabs in equal number to the second tabs of the first group of the second tabs T34b. A pitch between the first tabs T44 may be equal to a pitch between the second tabs T34. In other words, the width of the first tabs T44 may be equal to that of the second tabs T34.

Figure 15:
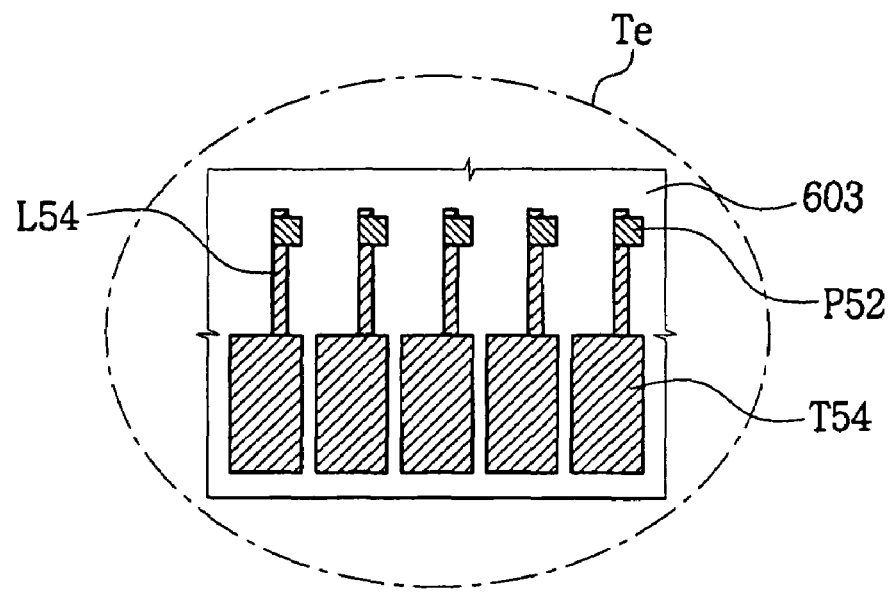

Referring to FIGS. 12 and 15, a number G' of fifth tabs T54 may be formed on the fifth surface 603. Here, G' may be an integer ranging from 2 to 1000. Also, G' may be equal to N. For instance, one hundred and twenty fifth tabs T54 may be formed on the fifth surface 603. The fifth tabs T54 may be connected to the fourth via plugs P52 by internal interconnection lines L54. The fifth tabs T54 may be provided in equal number to the first tabs of the second group of the first tabs T44a. A pitch between the fifth tabs T54 may be greater than a pitch between the first tabs T44. The width of the fifth tabs T54 may be equal to that of the fourth tabs T11.

A number H of sixth tabs T62, internal interconnection lines L62, and the fourth via plugs P52, which are about the same as described with reference to FIG. 9, may be formed on the sixth surface 604. Here, H may be an integer ranging from 2 to 1000. For example, one hundred and twenty sixth tabs T62 may be formed on the sixth surface 604. The sixth tabs T62 may be electrically connected to the fifth tabs T54 by the fourth via plugs P52. A pitch between the sixth tabs T62 may be equal to a pitch between the fifth tabs T54 and a pitch between the fourth tabs T11.

Figure 16:
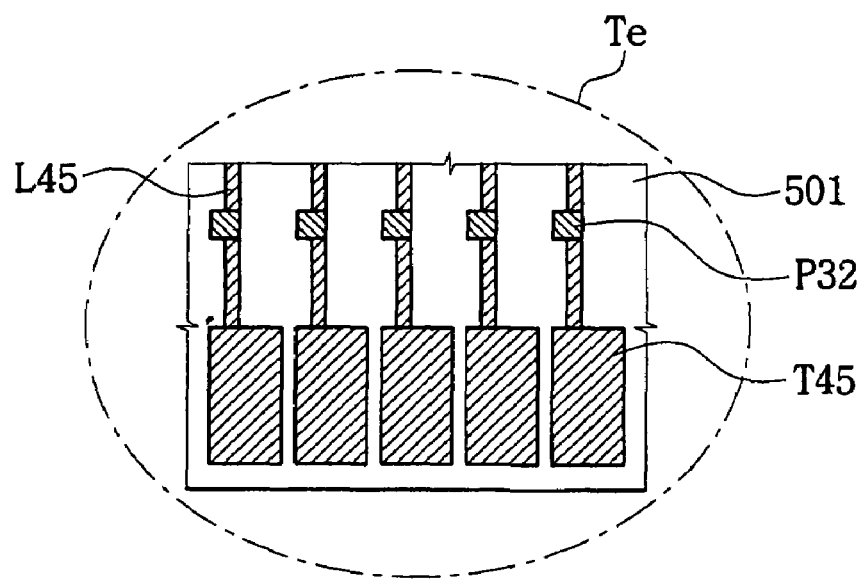

Referring to FIGS. 12 and 16, according to another example embodiment, a number L' of first tabs T45 may be formed on the first surface 501. Here, L' may be an integer ranging from 2 to 1000. Also, L' may be equal to G' and H. For example, one hundred and twenty first tabs T45 may be formed on the first surface 501. The first tabs T45 may be electrically connected to the first through fourth semiconductor devices 71, 72, 73, and 74 by internal interconnection lines L45. The first tabs T45 may be in contact with the third via plugs P32 through the internal interconnection lines L45. The first tabs T45 may be provided in equal number to the second tabs of the second group of the second tabs T34a. The first tabs T45 may be electrically connected to the second group of the second tabs T34a by the third via plugs P32. A pitch between the first tabs T45 may be greater than a pitch between the second tabs T34. The width of the first tabs T45 may be equal to that of the fourth tabs T11.

Referring to FIGS. 12 and 17, a first group of the third tabs T21a may be electrically connected to the fourth tabs T11 via the second via plugs P11 formed through the flexible PCB 60. The first group of the third tabs T21a may be electrically connected to the first group of the second tabs T34b by the conductive adhesive 91. The first tabs T44b, T44a, and T45 may be electrically connected to the fifth tabs T54 by the conductive adhesive 91. As a result, the fourth tabs T11 may be electrically connected to the first through eighth semiconductor devices 71, 72, 73, 74, 81, 82, 83, and 84 via the second via plugs P11, the conductive adhesive 91, and the internal interconnection lines L11, L21, and L33.

The surfaces of the rigid PCB 50 and the flexible PCB 60 may be covered with an insulating layer 7. The surfaces of the fourth tabs T11 and the sixth tabs T62 may be covered with a conductive layer with low corrosiveness and oxidation properties, for example, an Au layer 8.

Referring to FIGS. 12 and 18, the second group of the first tabs T44a and T45 may be electrically connected to the second group of the second tabs T34a via the third via plugs P32 formed through the rigid PCB 50. The fifth tabs T54 may be electrically connected to the sixth tabs T62 via the fourth via plugs P52 formed through the flexible PCB 60. The second group of the third tabs T21b may be electrically connected to the second group of the second tabs T34a by the conductive adhesive 91. The first tabs T44a, T44b, and T45 may be electrically connected to the fifth tabs T54 by the conductive adhesive 91. As a result, the sixth tabs T62 may be electrically connected to the first through eighth semiconductor devices 71, 72, 73, 74, 81, 82, 83, and 84 via the third and fourth via plugs P32 and P52 and the internal interconnection lines L22, L34, L44, L45, L54, and L62.

Referring again to FIGS. 2 and 12 through 18, the stacked semiconductor module according to Example embodiment 2 may be a DDR-2 memory module. In this case, the first through eighth semiconductor devices 71, 72, 73, 74, 81, 82, 83, and 84 may be DRAM devices. Also, the first through eighth semiconductor devices 71, 72, 73, 74, 81, 82, 83, and 84 may be single memory chips or MCPs. The flexible PCB 60 may be thinner than the rigid PCB 50.

One hundred and twenty fourth tabs T11, one hundred and twenty fifth tabs T54, and one hundred and twenty sixth tabs T62 may be provided, and two hundred and forty first tabs T44, two hundred and forty second tabs T34, and two hundred and forty third tabs T21 may be provided. Also, each of the first group of the first tabs T44b, the second group of the first tabs T44a, the first group of the second tabs T34b, the second group of the second tabs T34a, the first group of the third tabs T21a, and the second group of the third tabs T21b may include one hundred and twenty tabs. In another example embodiment, one hundred and twenty first tabs T45 may be provided.

The fourth tabs T11, the first group of the third tabs T21a, and the first group of the second tabs T34b may be electrically connected to one another by the second via plugs P11 and the conductive adhesive 91. Similarly, the sixth tabs T62, the fifth tabs T54, the first tabs T44b, T44a, and T45, the second group of the second tabs T34a, and the second group of the third tabs T21b may be electrically connected to one another by the third and fourth via plugs P32 and P52 and the conductive adhesive 91.

As a result, the fourth tabs T11 may be electrically connected to the first through eighth semiconductor devices 71, 72, 73, 74, 81, 82, 83, and 84 via the second via plugs P11, the conductive adhesive 91, and the internal interconnection lines L11, L21, and L33. Also, the sixth tabs T62 may be electrically connected to the first through eighth semiconductor devices 71, 72, 73, 74, 81, 82, 83, and 84 via the third and fourth via plugs P32 and P52, the conductive adhesive 91, and the internal interconnection lines L22, L34, L44, L45, L54, and L62.

The second through fourth via plugs P11, P32, and P52 may be formed adjacent to the first through sixth tabs T11, T21, T34, T44 (T45), T54, and T62. The second through fourth via plugs P11, P32, and P52 may greatly shorten electrical connection paths between the first through eighth semiconductor devices 71, 72, 73, 74, 81, 82, 83, and 84 and the fourth tabs T11 and electrical connection paths between the first through eighth semiconductor devices 71, 72, 73, 74, 81, 82, 83, and 84 and the sixth tabs T62. According to Example embodiment 2 as described above, a high-capacity stacked memory module can be embodied.

Example Embodiment 3

Figure 19:
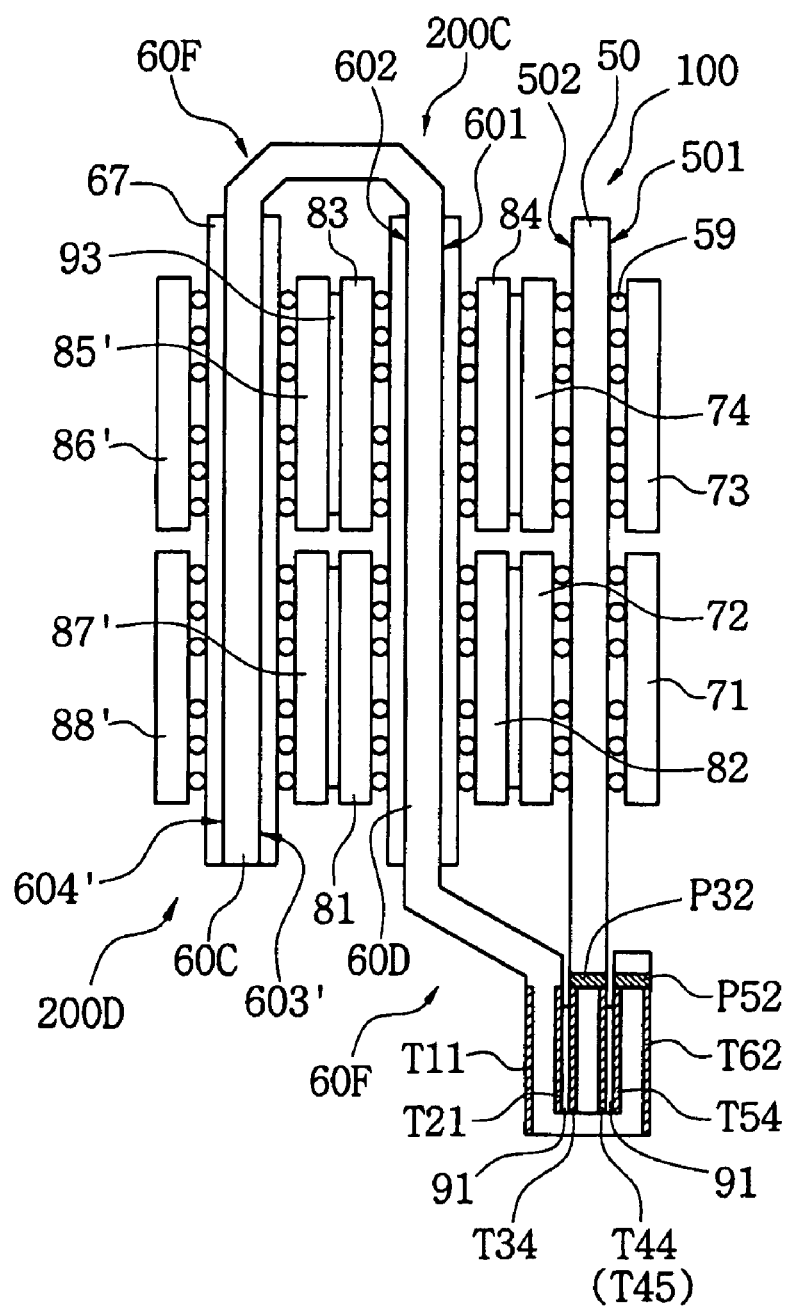

FIG. 19 is a cross-sectional view taken along line I-I', which illustrates a stacked semiconductor module according to another example embodiment.

Referring to FIG. 19, the stacked semiconductor module according to Example embodiment 3 may include a first semiconductor module 100, a second semiconductor module 200C, and a third semiconductor module 200D.

The first semiconductor module 100 may include a rigid PCB 50, first through fourth semiconductor devices 71, 72, 73, and 74, third via plugs P32, and first and second tabs T44, T45, and T34, which are about the same as described in Example embodiment 2.

The second semiconductor module 200C may include a flexible PCB 60D, fifth through eighth semiconductor devices 81, 82, 83, and 84, a subsidiary board 67, second via plugs (not shown), fourth via plugs P52, and third through sixth tabs T21, T11, T54, and T62, which are about the same as described in Example embodiment 2. One end portion of the flexible PCB 60D may fold to wrap an end portion of the rigid PCB 50. The flexible PCB 60D may overlap the rigid PCB 50. The flexible PCB 60D may be bonded to the rigid PCB 50 using a conductive adhesive 91. The second semiconductor module 200C may be bonded to the first semiconductor module 100 using an adhesive plate 93. The adhesive plate 93 may be bonded between the second semiconductor device 72 and the sixth semiconductor device 82 and between the fourth semiconductor device 74 and the eighth semiconductor device 84.

The third semiconductor module 200D may include a flexible PCB 60C, ninth through twelfth semiconductor devices 85', 86', 87', and 88', and a subsidiary board 67. The flexible PCBs 60C and 60D may be connected to each other. The subsidiary board 67 may not be bonded to a connection section 60F between the flexible PCBs 60C and 60D. The connection section 60F may easily bend. The third semiconductor module 200D may be bonded to the second semiconductor module 200C using the adhesive plate 93. The adhesive plate 93 may be bonded between the fifth semiconductor device 81 and the eleventh semiconductor device 87' and between the seventh semiconductor device 83 and the ninth semiconductor device 85'.

The flexible printed circuit board 60C may include a first surface 603' and a second surface 604' on opposite faces of the flexible printed circuit board 60C. The first surface 603' may support the ninth and eleventh semiconductor devices 85' and 87' and the second surface may support the twelfth and tenth semiconductor devices 88' and 86'. Likewise, the flexible printed circuit board 60D may include a first surface 602 and a second surface 601 on opposite faces of the flexible printed circuit board 60D. The first surface 602 may support the fifth and seventh semiconductor devices 81 and 83 and the second surface 601 may support the sixth and eighth semiconductor devices 82 and 84.

Example embodiment 4

Figure 20:
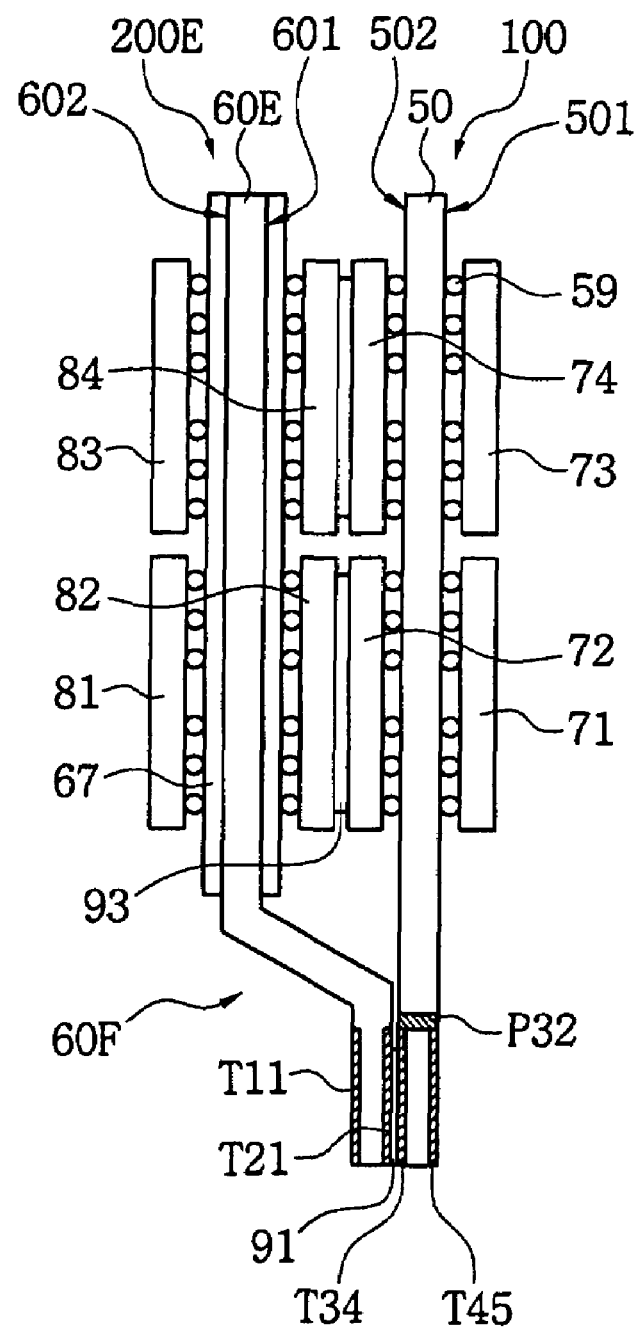

FIG. 20 is a cross-sectional view taken along line I-I', which illustrates a stacked semiconductor modules according to another example embodiment.

Referring to FIG. 20, the stacked semiconductor module according to example embodiment 4 may include a first semiconductor module 100 and a second semiconductor module 200E.

The first semiconductor module 100 may include a rigid PCB 50, first through fourth semiconductor devices 71, 72, 73, and 74, third via plugs P32, and first and second tabs T45 and T34, which are about the same as described in Example embodiment 2.

The second semiconductor module 200E may include a flexible PCB 60E, fifth through eighth semiconductor devices 81, 82, 83, and 84, a subsidiary board 67, second via plugs (not shown), and third and fourth tabs T21 and T11, which are about the same as described in Example embodiment 2. One end portion of the flexible PCB 60E may overlap an end portion of the rigid PCB 50. The flexible PCB 60E may be bonded to the rigid PCB 50 using a conductive adhesive 91. The second semiconductor module 200E may be bonded to the first semiconductor module 100 using an adhesive plate 93. The adhesive plate 93 may be bonded between the second semiconductor device 72 and the sixth semiconductor device 82 and between the fourth semiconductor device 74 and the eighth semiconductor device 84.

A number L' of first tabs T45 may be formed on the first surface 501 in about the same manner as described with reference to FIG. 16. Here, L' may be an integer ranging from 2 to 1000. For example, one hundred and twenty first tabs T45 may be formed on the first surface 501. The first tabs T45 may be electrically connected to the first through fourth semiconductor devices through internal interconnection lines L45. The first tabs T45 may be in contact with the third via plugs P32 through the internal interconnection lines L45.

A number N of fourth tabs T11, the internal interconnection lines L11, and the second via plugs P11, which are the same as described with reference to FIG. 4, may be formed on the fourth surface 602. Here, N may be an integer ranging from 2 to 1000. A number M of third tabs T21, internal interconnection lines L21 and L22, and second via plugs P1, which are the same as described with reference to FIG. 5, may be formed on the third surface 601. Here, M may be an integer ranging from 2 to 1000, which may be larger than N.

A number K of second tabs T34, which are the same as described with reference to FIG. 13, may be formed on the second surface 502. Here, K may be an integer ranging from 2 to 1000, which may be larger than L'. Also, K may be equal to M. For instance, two hundred and forty second tabs T34 may be formed on the second surface 502. A first group of the second tabs T34b may be electrically connected to the first through fourth semiconductor devices 71, 72, 73, and 74 by internal interconnection lines L33. A second group of the second tabs T34a may be in contact with the third via plugs P32 through other internal interconnection lines L34. The second group of the second tabs T34a may include second tabs in equal number to the third tabs of the second group of the third tabs T21b. Also, the second group of the second tabs T34a may include second tabs in equal number to the first tabs T45.

The second tabs of the first group T34b and the second tabs of the second group T34a may be arranged alternately on the second surface 502. The first group of the second tabs T34b may include second tabs in equal number to the fourth tabs T11. For example, the first group T34b may include a number N of second tabs. Therefore, the first group T34b may include one hundred and twenty second tabs. A pitch between the second tabs T34a and T34b may be equal to a pitch between the third tabs in groups T21a and T21b. In other words, the width of the second tabs in groups T34a and T34b may be equal to that of the third tabs in groups T21a and T21b.

The stacked semiconductor module according to Example embodiment 4 may be a DDR-2 memory module. In this case, the first through eighth semiconductor devices 71, 72, 73, 74, 81, 82, 83, and 84 may be DRAM devices. Also, the first through eighth semiconductor devices 71, 72, 73, 74, 81, 82, 83, and 84 may be single memory chips or MCPs. The flexible PCB 60E may be thinner than the rigid PCB 50.

One hundred and twenty fourth tabs T11 and one hundred and twenty first tabs T45 may be provided, and two hundred and forty second tabs T34 and two hundred and forty third tabs T21 may be provided. Also, each of the first group of the second tabs T34b, the second group of the second tabs T34a, the first group of the third tabs T21a, and the second group of the third tabs T21b may include one hundred and twenty tabs.

The fourth tabs T11, the first group of the third tabs T21a, and the first group of the second tabs T34b may be electrically connected to one another by the second via plugs P11 and the conductive adhesive 91. Similarly, the first tabs T45, the second group of the second tabs T34a, and the second group of the third tabs T21b may be electrically connected to one another by the third via plugs P32 and the conductive adhesive 91.

As a result, the fourth tabs T11 may be electrically connected to the first through eighth semiconductor devices 71, 72, 73, 74, 81, 82, 83, and 84 via the second via plugs P11, the conductive adhesive 91, and the internal interconnection lines L1, L21, and L33. Also, the first tabs T45 may be electrically connected to the first through eighth semiconductor devices 71, 72, 73, 74, 81, 82, 83, and 84 via the third via plugs P32, the conductive adhesive 91, and the internal interconnection lines L22, L34, and L45.

The second and third via plugs P11 and P32 may be formed adjacent to the first through fourth tabs T11, T21, T34, and T45. The second and third via plugs P11 and P32 may greatly shorten electrical connection paths between the first through eighth semiconductor devices 71, 72, 73, 74, 81, 82, 83, and 84 and the fourth tabs T11 and electrical connection paths between the first through eighth semiconductor devices 71, 72, 73, 74, 81, 82, 83, and 84 and the first tabs T45.

Example embodiment 5

FIGS. 21 through 24 are cross-sectional views illustrating a method of fabricating a stacked semiconductor module according to yet another example embodiment. The stacked semiconductor module formed according to Example embodiment 5 may be almost the same as the stacked semiconductor module shown in FIG. 12, according to example embodiment 2.

Figure 21:
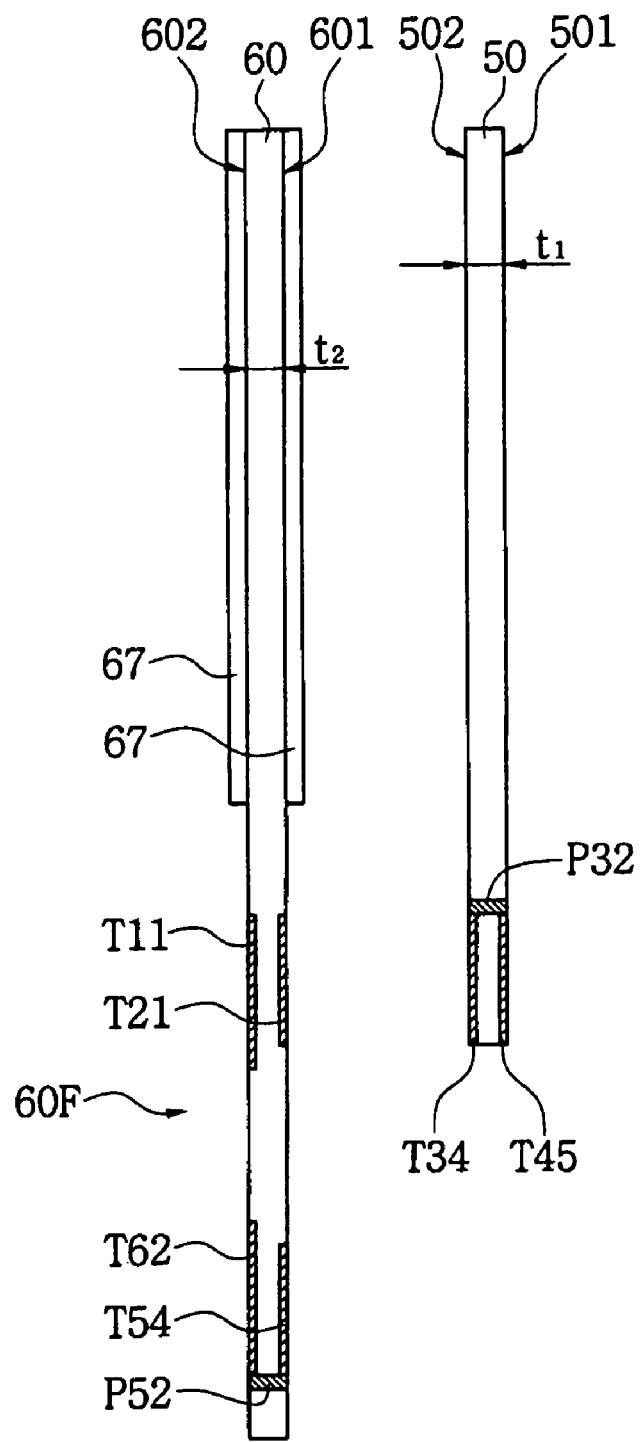

Referring to FIG. 21, a rigid PCB 50 and a flexible PCB 60 may be prepared. A subsidiary board 67 may be formed on a partial region of the flexible PCB 60. In this case, a combination of the flexible PCB 60 and the subsidiary board 67 may be called a rigid-flexible PCB.

The rigid PCB 50 may be formed to have third via plugs P32 and first and second tabs T45 and T34. The rigid PCB 50 may have a first surface 501 and a second surface 502 on opposite sides of the rigid printed circuit board 50. The surfaces may be separated by the thickness t1 of the rigid printed circuit board 50. The first tabs T45 may be the same as described with reference to FIG. 16, and the second tabs T34 may be the same as described with reference to FIG. 13. The third via plugs P32 may be formed adjacent to the first and second tabs T45 and T34 to penetrate the rigid PCB 50. The first tabs T45 may be electrically connected to a second group of the second tabs T34a via the third via plugs P32. The third via plugs P32 may be formed of Cu, W, WN, Ti, TiN, Ta, TaN, or a combination thereof.

For example, the rigid PCB 50 may be formed of a single or multiple prepreg layer and Cu foil formed therebetween. The first and second tabs T45 and T34 may be formed at an end portion of the rigid PCB 50. The rigid PCB 50 may be formed to a thickness of about 0.6 mm.

The flexible PCB 60 may be formed to have second via plugs (refer to P11 in FIG. 17), fourth via plugs P52, and third through sixth tabs T21, T11, T54, and T62. The flexible PCB 60 may have a third surface 601 and a fourth surface 602 on opposite faces of the flexible PCB 60 and may be separated by the thickness t2 of the flexible PCB 60. The surfaces 601 and 602 may be separated by a thickness t2 of the flexible PCB 60. The third tabs T21 may be the same as described with reference to FIG. 5, the fourth tabs T11 may be the same as described with reference to FIG. 4, the fifth tabs T54 may be the same as described with reference to FIG. 15, and the sixth tabs T62 may be the same as described with reference to FIG. 18.

For example, the flexible PCB 60 may be formed of a single or multiple flexible film and Cu foil interposed therebetween. The flexible PCB 60 may be formed to a thickness of about 0.3 mm, which is smaller than the thickness of the rigid PCB 50. The second via plugs P11 and the fourth via plugs P52 may be formed through the flexible PCB 60. The second via plugs P11 may be formed adjacent to the third and fourth tabs T21 and T11. The fourth via plugs P52 may be formed adjacent to the fifth and sixth tabs T54 and T62. The second via plugs P11 and the fourth via plugs P52 may be formed of Cu, W, WN, Ti, TiN, Ta, TaN, or a combination thereof. The fourth tabs T11 may be electrically connected to a first group of the third tabs T21a via the second via plugs P11. The sixth tabs T62 may be electrically connected to the fifth tabs T54 via the fourth via plugs P52.

The subsidiary board 67 may be formed by sequentially stacking prepreg and Cu foil. The subsidiary board 67 may serve as a redistribution layer. Also, the subsidiary board 67 may function to reduce the bending effect of the flexible PCB 60. In other words, a portion of the flexible PCB 60 to which the subsidiary board 67 is bonded may be relatively stiff. However, a process of forming the subsidiary board 67 may be omitted. The subsidiary board 67 may not be bonded to the third and sixth tabs T21, T11, T54, and T62 and their adjacent regions. A portion of the flexible PCB 60 on which the subsidiary board 67 is not mounted may be defined as a connection section 60F. The connection section 60F may easily bend.

As shown in FIG. 21, the subsidiary board 67 may be formed on the surface of the flexible PCB 60. In another example embodiment, the subsidiary board 67 may be embedded between a plurality of flexible films constituting the flexible PCB 60, although a description thereof will be omitted for brevity.

Figure 22:
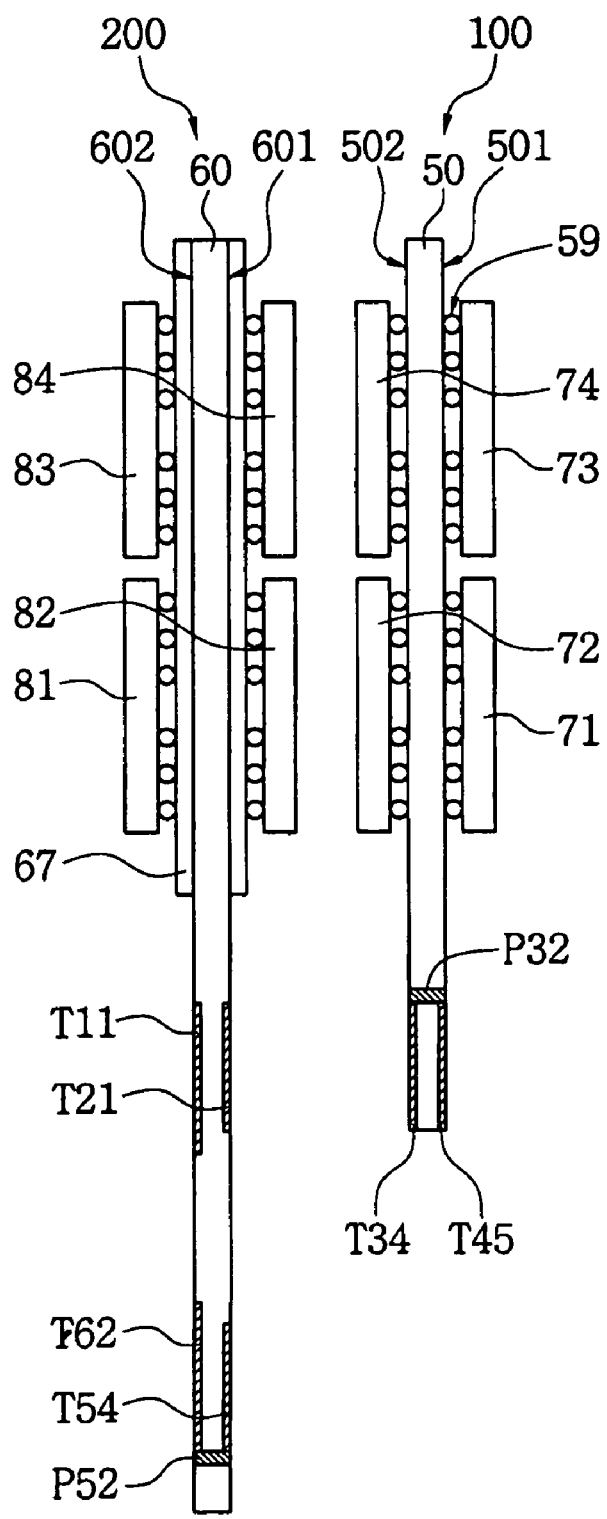

Referring to FIG. 22, first through eighth semiconductor devices 71, 72, 73, 74, 81, 82, 83, and 84 may be mounted on the rigid PCB 50 and the flexible PCB 60 using conductive connection units, for example, solder balls 59. As shown in FIG. 22, the fifth through eighth memory devices 81, 82, 83, and 84 may be mounted on the subsidiary board 67.

Figure 23:
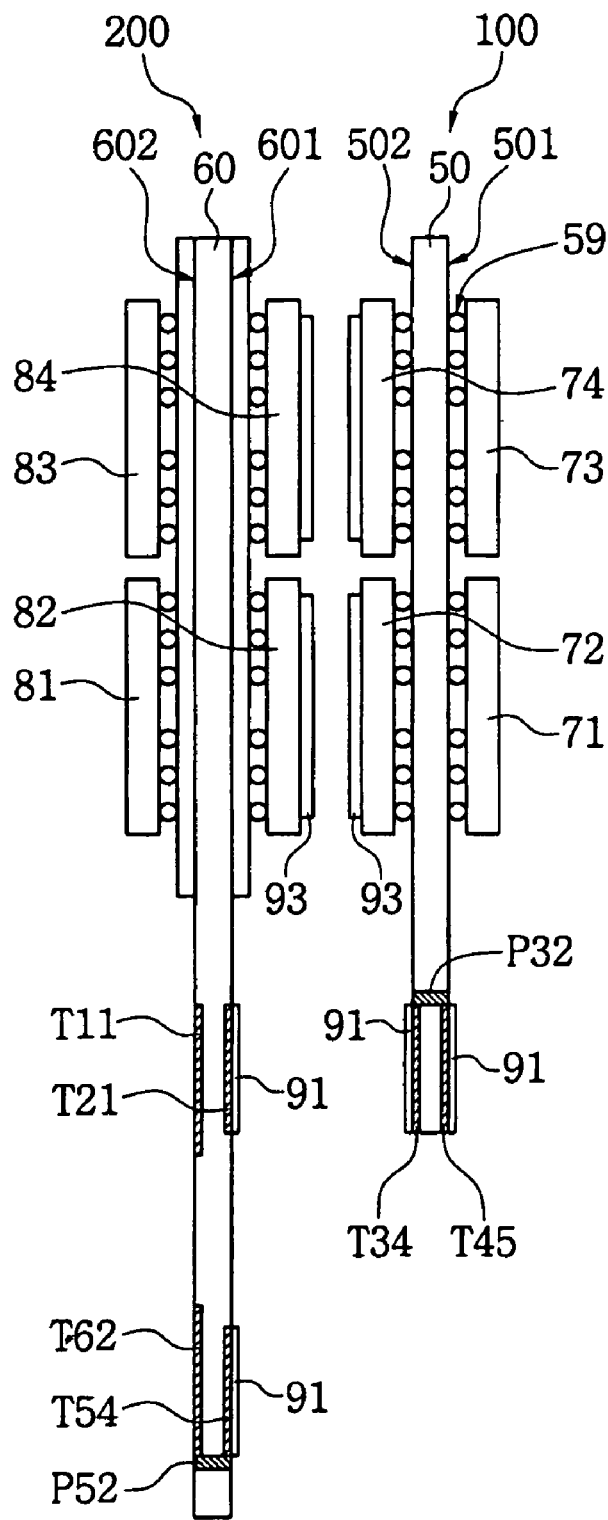

Referring to FIG. 23, a conductive adhesive 91 may be coated on the first through third tabs T45, T34, T21, and the fifth tabs T54. The conductive adhesive 91 may be formed of an ACF or ACP. The conductive adhesive 91 may be selectively omitted.

An adhesive plate 93 may be bonded to the surfaces of the second semiconductor device 72, the fourth semiconductor device 74, the sixth semiconductor device 82, and the eighth semiconductor device 84. The adhesive plate 93 may be an adhesive tape functioning as a heat sink. In another case, the adhesive plate 93 may be selectively bonded to one or more of the surfaces of the second semiconductor device 72, the fourth semiconductor device 74, the sixth semiconductor device 82, and the eighth semiconductor device 84.

Figure 24:
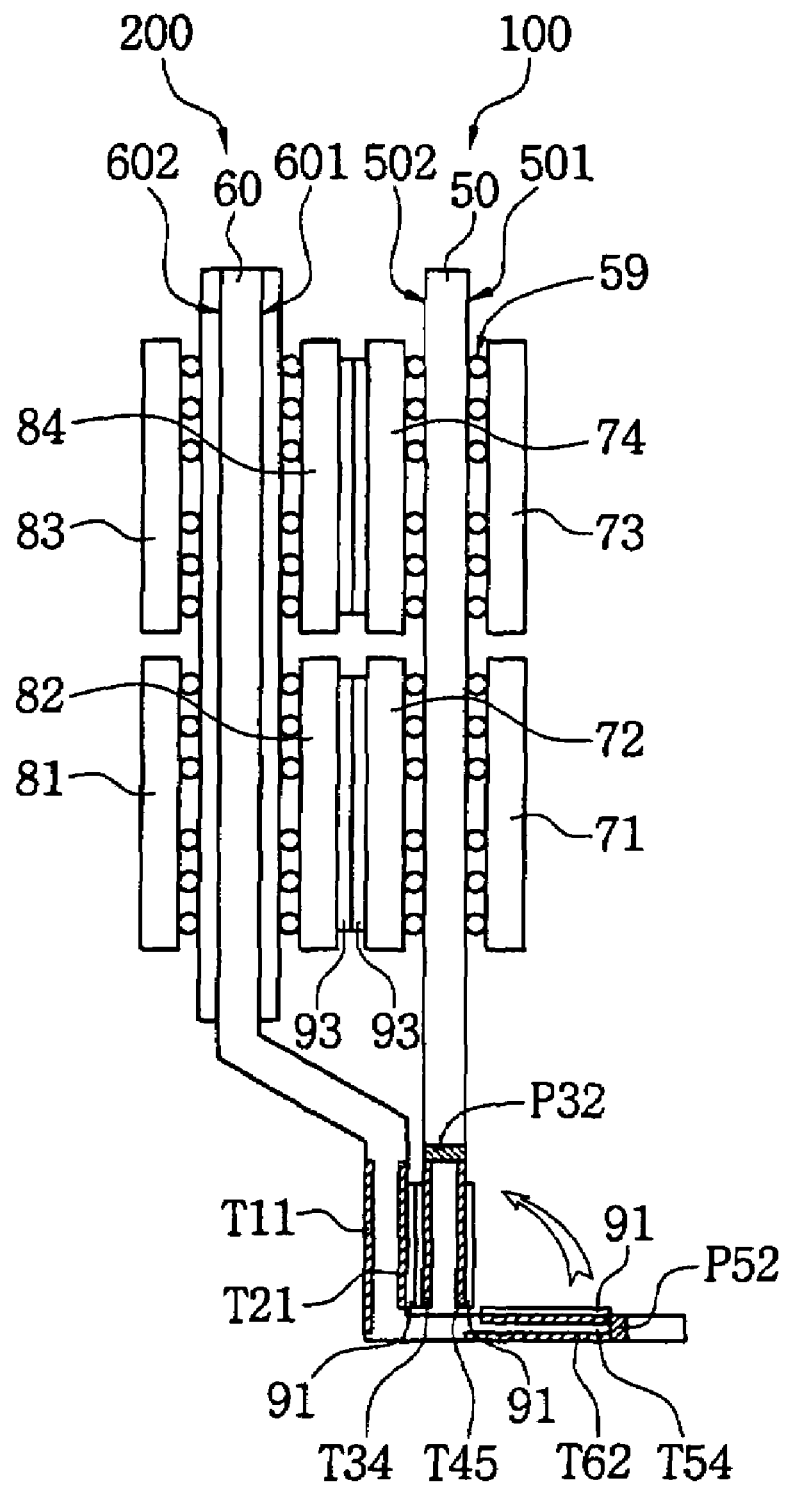

Referring to FIGS. 12 and 24, the flexible PCB 60 may bend or fold to contact the rigid PCB 50. For example, an end portion of the flexible PCB 60 may fold to wrap an end portion of the rigid PCB 50. The second tabs T34 may face the third tabs T21, and the first tabs T45 may face the fifth tabs T54. The second tabs T34 and the third tabs T21 may be bonded to each other using the conductive adhesive 91, and the first tabs T45 and the fifth tabs T54 also may be bonded to each other using the conductive adhesive 91. The conductive adhesive 91 may bond tabs using pressure and/or heat. The conductive adhesive 91 may function to provide mechanical/electrical connection between the first tabs T45 and the fifth tabs T54 and between the second tabs T34 and the third tabs T21.

The adhesive plate 93 may be connected between the second semiconductor device 72 and the sixth semiconductor device 82 and between the fourth semiconductor device 74 and the eighth semiconductor device 84. The adhesive plate 93 may fix the semiconductor devices 72, 82, 74, and 84 to one another.

Although methods of fabricating the stacked semiconductor module according to Example embodiment 2 are chiefly described above with reference to FIGS. 21 through 24, methods of fabricating the stacked semiconductor modules according to other example embodiments are also applicable within the same technical scope.

According to the example embodiments of the inventive concept, a stacked semiconductor module including first and second semiconductor modules is provided. The first semiconductor module includes a rigid PCB and a plurality of semiconductor devices mounted on the rigid PCB. The second semiconductor module includes a flexible PCB and a plurality of other semiconductor devices mounted on the flexible PCB. The flexible PCB is connected to the rigid PCB. The bending and folding properties of the flexible PCB facilitates the connection of the flexible PCB to the rigid PCB and ensures reliability. Furthermore, tabs of the rigid PCB are electrically connected to tabs of the flexible PCB by via plugs. As a result, signal transmission paths between the tabs and the semiconductor devices can be markedly shortened.

While example embodiments have been disclosed herein, it should be understood that other variations may be possible. For example, some or all of the above-described semiconductor devices may be replaced by other semiconductor devices, such as microprocessors or programmable logic chips. Such variations are not to be regarded as a departure from the spirit and scope of example embodiments of the present application, and all such modifications as would be obvious to one skilled in the art are intended to be included within the scope of the following claims.

What is claimed is:

1. A stacked semiconductor module comprising:
a first semiconductor module including a rigid printed circuit board (PCB) and a plurality of first semiconductor devices mounted on the rigid PCB, wherein the rigid PCB has a first surface and an oppositely facing second surface, a number L of first tabs are on the first surface, and a number K of second tabs are on the second surface;
a second semiconductor module adjacent to the second surface and including a first flexible PCB and a plurality of second semiconductor devices mounted on the first flexible PCB, wherein the first flexible PCB has a third surface and an oppositely facing fourth surface, a number M of third tabs are on the third surface, and a number N of fourth tabs are on the fourth surface;
a first conductive adhesive between the second tabs and the third tabs; and
wherein each of K, L, M, and N is an integer ranging from 2 to 1000, and the third tabs are electrically connected to corresponding ones of the second tabs; and
wherein the first tabs, the second tabs, the third tabs, and the fourth tabs are inserted into a connector.

2. The stacked semiconductor module of claim 1, wherein the first conductive adhesive includes at least one of an anisotropic conductive film (ACF) and an anisotropic conductive paste (ACP).

3. The stacked semiconductor module of claim 1, further comprising:
an adhesive plate between the first semiconductor module and the second semiconductor module, wherein the adhesive plate contacts the first semiconductor devices and the second semiconductor devices.

4. The stacked semiconductor module of claim 1, further comprising:
a subsidiary board on the first flexible PCB, wherein the second semiconductor devices are mounted on the subsidiary board, and the subsidiary board includes prepreg and Cu foil.

5. The stacked semiconductor module of claim 1, wherein the first semiconductor devices and the second semiconductor devices include at least one of a single memory chip, a multi-chip package (MCP), a microprocessor, and a programmable logic chip.

6. The stacked semiconductor module of claim 1, further comprising:
first via plugs through the first flexible PCB; and
second via plugs through the rigid PCB,
wherein the fourth tabs are electrically connected to a first group of the third tabs via the first via plugs, the first group of the third tabs are electrically connected to a first group of the second tabs via the first conductive adhesive, the first tabs are electrically connected to a second group of the second tabs via the second via plugs, and the second group of the second tabs are electrically connected to a second group of the third tabs via the first conductive adhesive.

7. The stacked semiconductor module of claim 6, wherein the first via plugs are between the second semiconductor devices and the fourth tabs, and the second via plugs are between the first semiconductor devices and the first tabs and the first and second via plugs are adjacent to the first and fourth tabs.

8. The stacked semiconductor module of claim 6, wherein M is larger than N, K is larger than L, and M is equal to K.

9. The stacked semiconductor module of claim 6, wherein the first group of the second tabs and the second group of the second tabs are arranged alternately, the first group of third tabs and the second group of third tabs are arranged alternately, and a pitch between the third tabs is smaller than a pitch between the fourth tabs.

10. The stacked semiconductor module of claim 6, further comprising:
a second flexible PCB having a fifth surface and an oppositely facing sixth surface, wherein the fifth surface faces the first surface and a number G of fifth tabs are on the fifth surface, a number H of sixth tabs are on the sixth surface, and the second flexible PCB is connected to one end portion of the first flexible PCB;
third via plugs through the second flexible PCB; and
a second conductive adhesive between the fifth tabs and the first tabs,
wherein each of G and H is an integer ranging from 2 to 1000, the sixth tabs are electrically connected to the fifth tabs via the third via plugs, and the fifth tabs are electrically connected to the first tabs via the second conductive adhesive.

11. The stacked semiconductor module of claim 10, wherein G is equal to H, and L is larger than or equal to G.

12. The stacked semiconductor module of claim 6, further comprising:
a second flexible PCB connected to one end portion of the first flexible PCB, the second flexible PCB having a fifth surface and an oppositely facing sixth surface, wherein the fifth surface faces the fourth surface; and
third semiconductor devices mounted on the second flexible PCB.

13. The stacked semiconductor module of claim 1, further comprising:
a second flexible PCB having a fifth surface and an oppositely facing sixth surface, wherein the fifth surface faces the first surface and a number G of fifth tabs are on the fifth surface, a number H of sixth tabs are on the sixth surface, and the second flexible PCB is connected to one end portion of the first flexible PCB;
first via plugs through the first flexible PCB;
second and third via plugs through the rigid PCB;
fourth via plugs through the second flexible PCB;
a second conductive adhesive between the fifth tabs and the first tabs; and
third semiconductor devices mounted on the second flexible PCB,
wherein the fourth tabs are electrically connected to a first group of the fifth tabs via the first via plugs, a first group of the third tabs, the first conductive adhesive, a first group of the second tabs, the second via plugs, a first group of the first tabs, and the second conductive adhesive, and the sixth tabs are electrically connected to a second group of the third tabs via the fourth via plugs, a second group of the fifth tabs, the second conductive adhesive, a second group of the first tabs, the third via plugs, a second group of the second tabs, and the first conductive adhesive.

14. The stacked semiconductor module of claim 13, wherein M is larger than N, G is larger than H, and M is equal to K, L, and G.

15. An electronic system comprising:
an electronic board; and
a stacked semiconductor module on the electronic board, the stacked semiconductor module including,
a first semiconductor module with a rigid printed circuit board (PCB) and a plurality of first semiconductor devices on the rigid PCB, wherein the rigid PCB has a first surface and an oppositely facing second surface, a number L of first tabs are on the first surface, and a number K of second tabs are on the second surface,
a second semiconductor module adjacent to the second surface and including a first flexible PCB and a plurality of second semiconductor devices mounted on the first flexible PCB, wherein the first flexible PCB has a third surface and an oppositely facing fourth surface, a number M of third tabs are on the third surface, and a number N of fourth tabs are on the fourth surface, and
a first conductive adhesive between the second tabs and the third tabs, wherein each of K, L, M, and N is an integer ranging from 2 to 1000, and the third tabs are electrically connected to corresponding ones of the second tabs; and
wherein the first tabs, the second tabs, the third tabs, and the fourth tabs are inserted into a connector.

16. The electronic system of claim 15, further comprising:
first via plugs through the first flexible PCB; and
second via plugs through the rigid PCB,
wherein the fourth tabs are electrically connected to a first group of the third tabs via the first via plugs, the first group of the third tabs are electrically connected to a first group of the second tabs via the first conductive adhesive, the first tabs are electrically connected to a second group of the second tabs via the second via plugs, and the second group of the second tabs are electrically connected to a second group of the third tabs via the first conductive adhesive.

17. The electronic system of claim 16, further comprising:
a second flexible PCB having a fifth surface and an oppositely facing sixth surface, wherein the fifth surface faces the first surface and a number G of fifth tabs are on the fifth surface, a number H of sixth tabs are on the sixth surface, and the second flexible PCB is connected to one end portion of the first flexible PCB;
third via plugs through the second flexible PCB; and
a second conductive adhesive between the fifth tabs and the first tabs,
wherein each of G and H is an integer ranging from 2 to 1000, the sixth tabs are electrically connected to the fifth tabs via the third via plugs, and the fifth tabs are electrically connected to the first tabs via the second conductive adhesive.

18. The electronic system of claim 15, further comprising:
a second flexible PCB having a fifth surface and an oppositely facing sixth surface, wherein the fifth surface faces the first surface and a number G of fifth tabs are on the fifth surface, a number H of sixth tabs are on the sixth surface, and the second flexible PCB is connected to one end portion of the first flexible PCB;
first via plugs through the first flexible PCB;
second and third via plugs through the rigid PCB;
fourth via plugs through the second flexible PCB;
a second conductive adhesive between the fifth tabs and the first tabs; and
third semiconductor devices mounted on the second flexible PCB,
wherein the fourth tabs are electrically connected to a first group of the fifth tabs via the first via plugs, a first group of the third tabs, the first conductive adhesive, a first group of the second tabs, the second via plugs, a first group of the first tabs, and the second conductive adhesive, and the sixth tabs are electrically connected to a second group of the third tabs via the fourth via plugs, a second group of the fifth tabs, the second conductive adhesive, a second group of the first tabs, the third via plugs, a second group of the second tabs, and the first conductive adhesive.

* * * * *